United States Patent
Tsuchiya et al.

(10) Patent No.: US 6,204,912 B1
(45) Date of Patent: Mar. 20, 2001

(54) EXPOSURE METHOD, EXPOSURE APPARATUS, AND MASK

(75) Inventors: Makoto Tsuchiya, Kawasaki; Kei Nara, Yokohama; Nobutaka Fujimori, Fujisawa; Manabu Toguchi, Kawagoe; Masami Seki, Shiki, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 08/848,394

(22) Filed: May 8, 1997

(30) Foreign Application Priority Data

May 8, 1996 (JP) .................................................. 8-139429
Aug. 13, 1996 (JP) .................................................. 8-213414

(51) Int. Cl.[7] ........................... G03B 27/42; G01B 11/00; H01L 21/27
(52) U.S. Cl. ................................ 355/53; 356/401; 430/5; 430/22
(58) Field of Search ............................. 355/53; 356/399, 356/400, 401; 430/5, 22; 250/559.26, 559.27, 559.3

(56) References Cited

U.S. PATENT DOCUMENTS

| | | | |
|---|---|---|---|
| 5,005,046 | * | 4/1991 | Hashimoto .............................. 355/53 |
| 5,403,754 | * | 4/1995 | Jackson .................................... 437/8 |
| 5,442,418 | | 8/1995 | Murakami et al. . |
| 5,502,313 | * | 3/1996 | Nakamura et al. ............. 250/559.26 |
| 5,715,037 | * | 2/1998 | Saiki et al. .............................. 355/53 |
| 5,721,606 | * | 2/1998 | Jain ........................................ 355/53 |
| 5,729,331 | * | 3/1998 | Tanaka et al. ........................... 355/53 |
| 5,835,196 | * | 11/1998 | Jackson .................................. 355/53 |

\* cited by examiner

*Primary Examiner*—Alan A. Mathews
(74) *Attorney, Agent, or Firm*—Nixon & Vanderhye P.C.

(57) ABSTRACT

An exposure method, exposure apparatus and mask are suitable for manufacturing an active matrix liquid crystal display including, for example, a gate electrode layer and a source/drain electrode layer. A stitching portion between unit patterns in a second layer is offset from the stitching portion in a first layer by a predetermined distance. The stitching portions of the second layer are always positioned over unit patterns of the first layer. Accordingly, the contrast gap that occurs at the stitching portion as a boundary is defined only by an error in the exposure position of the second layer. The contrast gap is not affected by an error in the exposure position of the first layer, unlike the conventional method. Because the contrast gap caused by the error in the exposure position of the first layer is eliminated, the total contrast gap that occurs at the stitching portion as a boundary is significantly reduced.

22 Claims, 16 Drawing Sheets

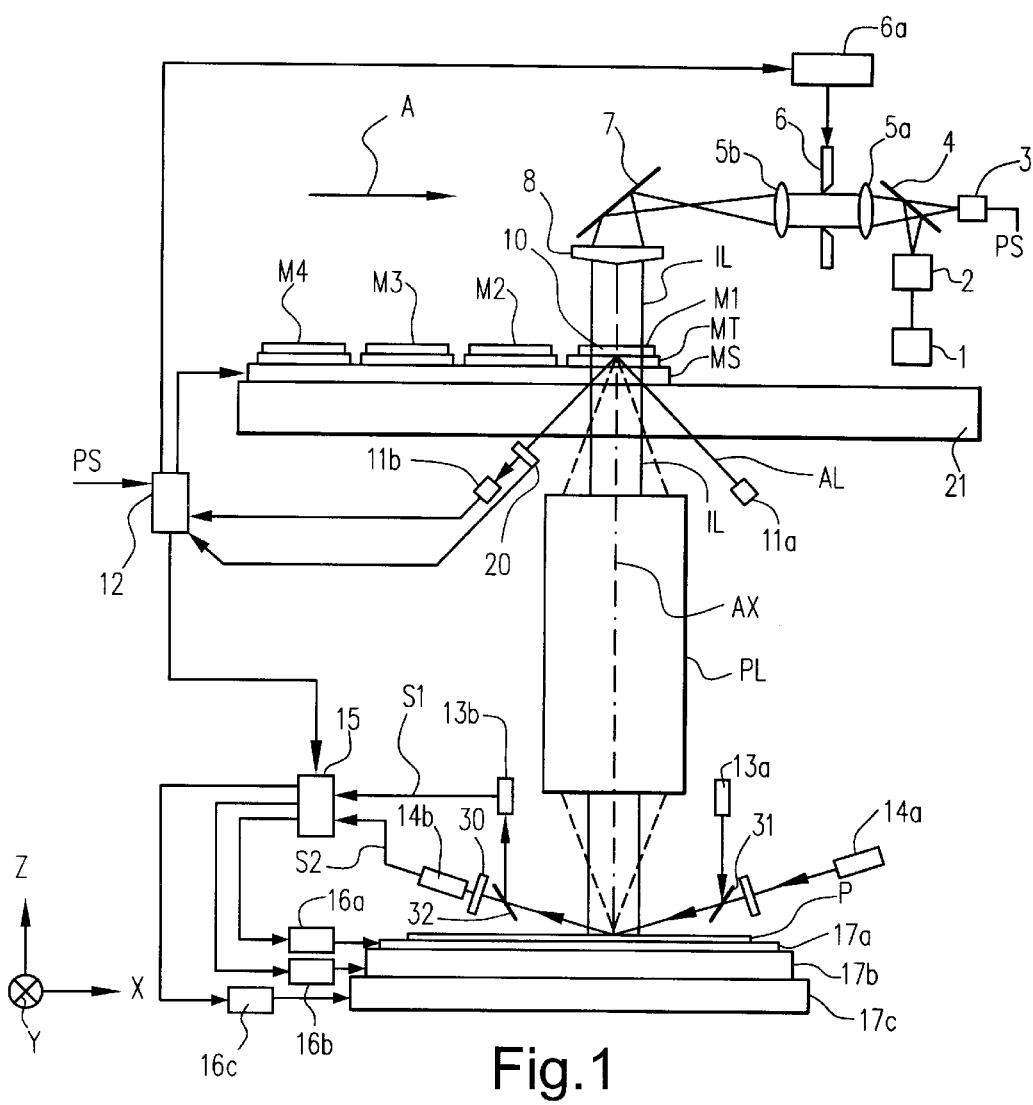
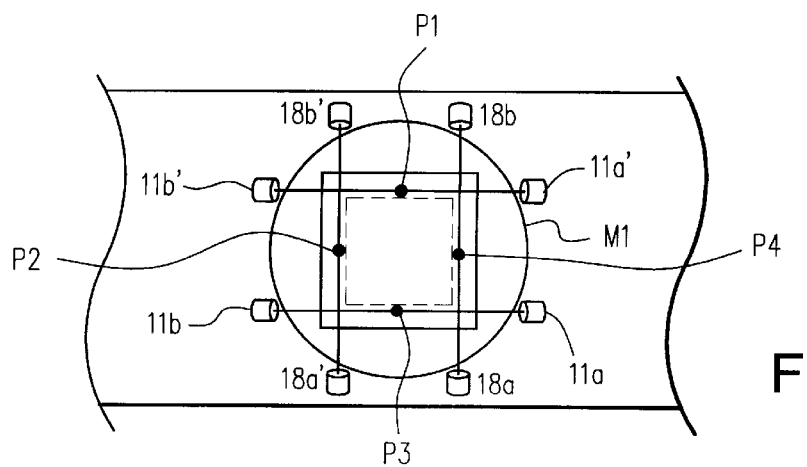
Fig.1
Fig.2

EXPOSURE METHOD, EXPOSURE APPARATUS, AND MASK

BACKGROUND OF THE INVENTION

This invention relates generally to exposure apparatus and methods and, more particularly, to an exposure method, an exposure apparatus, and a mask that are suitable for, for example, manufacturing an active matrix liquid crystal display (liquid crystal panel) having a switching device.

In recent years, a high-resolution color liquid crystal display (LCD) with a wide screen has been used as a display for personal computers or television sets. The screen size (screen diagonal) of a current LCD is typically 10–12 inches; however, a wide screen LCD with a 16-inch screen, 20-inch screen, or still wider screen, is being developed. In response to the increased screen size, the resolution is also improved, and an LCD having a VGA (640X480) pixel matrix, XGA (1024X768) pixel matrix, or SXGA (1280X1024) pixel matrix is being manufactured. An active matrix LCD is superior in the response characteristic of image display, wide view angle characteristics, and multi-tone characteristics. In many applications, a thin film transistor LCD (TFT/LCD), which uses a thin film transistor as a switching device in each pixel, has been used.

FIG. 16 illustrates an example of the pixel structure of a TFT/LCD in a conventional display device as an enlarged plan view, which shows a portion of the array substrate (on which TFTs are formed). A plurality of gate lines 132 are formed on the glass substrates 142 along the horizontal direction of a display screen, and a plurality of data lines 130 are formed in the vertical direction. Areas defined by the gate lines 132 and the data lines 130 are display pixel areas, in which a transparent pixel electrode 134 made of ITO (indium tin oxide) is formed. A gate electrode 136, which is derived from the gate line 132, is formed in a corner of each display area. A channel layer 144 made of, for example, amorphous silicon (α-Si) is formed on the gate electrode 136 with a gate insulation film (not shown) therebetween. A drain electrode 140, which is derived from the data line 130, and a source electrode 138, which is electrically connected to the transparent electrode 134, are formed on the channel layer 144 simultaneously. A TFT is composed of a gate electrode 136, a gate insulation film, a channel layer 144, and source and drain electrodes 136, 140.

The circuit pattern in each layer, which constitutes a TFT/LCD, is formed through a photolithographic process, in which a projection exposure apparatus is used to expose the circuit pattern formed on a photomask or reticle (collectively, referred to as a reticle) onto a resist layer (photosensitizer) formed on the glass substrate 142. The resist layer is developed and used as a mask on which the circuit pattern has been transferred. Using the photoresist mask, a semiconductor layer made of, for example, α-Si is etched to form the channel layer 144. The gate line 132, gate electrode 136, data line 130 and source/drain electrodes 138, 140 are formed by etching a metal interconnection layer.

There are two types of exposure apparatus, namely, a step-and-repeat-type and a scanning-type. In a scanning-type exposure apparatus, the reticle and the glass substrate are moved in synchronization with each other.

In a step-and-repeat-type apparatus, the photosensitive substrate (glass substrate) mounted on the movable stage is driven in a step-and-repeating manner to successively expose a portion of the reticle pattern onto a predetermined area on the photosensitive substrate in a section-by-section manner. In this type of exposure apparatus, a plurality of reticles are held in a reticle changer. The reticle changer and the stage are driven so as to successively expose a portion of the multiple reticle patterns onto one of the divided pattern areas on the photosensitive substrate, thereby forming a first layer. Other patterns on different reticles held in the reticle changer are subsequently exposed to form a second layer over the first layer.

FIG. 17 illustrates the first and second layers LY1 and LY2 exposed onto the photosensitive substrate P, which is mounted on the movable stage of an exposure apparatus. Unit patterns LY1A and LY1B of the first layer LY1 are exposed successively onto the photosensitive substrate P, and LY1A and LY1B are combined through a stitching portion JN. Similarly, unit patterns LY2A and LY2B of the second layer LY2 are successively exposed over the first layer, and LY2A and LY2B are combined through the stitching portion JN.

The movable stage (not shown in FIG. 17) that supports the photosensitive substrate P is moved within the X-Y plane in a controllable manner, and the position of the photosensitive substrate P mounted on the movable stage is controlled within the X–Y coordinate system. If, for example, the first unit pattern LY1A of the first layer LY1 is exposed onto the substrate with an offset of $-\Delta x$ from the target exposure position, and the first unit pattern LY2A of the second layer LY2 is exposed with an offset of $+\Delta x$ from the target exposure position, then the offset of the first pattern LY2A of the second layer LY2 becomes $+2\Delta x$ relative to the first unit pattern LY1A of the first layer LY1, which corresponds to the distance between the exposure positions of LY1A and LY2A.

If the second unit pattern LY1B of the first layer LY1 is exposed with an offset of $+\Delta x$ from the target exposure position, and the second unit pattern LY2B of the second layer LY2 is exposed with an offset of $-\Delta x$ from the target exposure position, then the offset of the second unit pattern LY2B of the second layer LY2 becomes $-2\Delta x$ relative to the second unit pattern LY1B of the first layer LY1, which is the distance between the exposure positions of LY1B and LY2B. Accordingly, the total offset of the second layer LY2 relative to the first layer LY1 becomes $+4\Delta x$ with respect to the stitching JN, as shown in FIG. 18.

If such an offset occurs during the exposure process, in a thin film transistor of the liquid crystal panel, the drain electrode DR and the source electrode SO formed in the second layer LY2 are offset by $+4\Delta x$ relative to the gate electrode GA formed in the first layer LY1, as shown in FIG. 19.

The hatched areas PIL1 and PIL2 of the drain electrodes DR, which overlap the gate electrodes GA, define the capacitor capacitance generated between the gate electrode GA and the drain electrode DR. Change in the capacitance results in variation in the holding voltage of the thin film transistor. If the overlapping areas PIL1 and PIL2 differ in the left and right sides of the liquid crystal panel with the stitching portion JN as a boundary, the light-permeability of the liquid crystal panel varies from area to area. Consequently, the contrast differs between the left and right halves of the liquid crystal panel, separated at the stitching portion JN.

As the glass substrate 142 is enlarged along with the increased size of TFT/LCDs, a scanning-type projection exposure apparatus with a plurality of projection lens systems has been preferably used to increase the projection exposure area of the apparatus. In such a scanning-type projection exposure apparatus, the circuit pattern on a reticle is divided into multiple trapezoid areas when exposed onto a glass substrate. The reticle and the glass substrate are synchronously scanned with respect to the projection lens systems. In this manner, the entire area of the reticle circuit pattern is transferred to the glass substrate.

FIG. 20(a) shows a portion of the projection area formed on the glass substrate 142 by a scanning-type projection exposure apparatus. The trapezoid projection areas 150, 152 formed through individual projection lens systems overlap each other in the Y direction by a predetermined amount. This arrangement enables the circuit pattern to be illuminated uniformly. In the figure, the glass substrate 142 moves in the X direction relative to the projection areas 150, 152. The range "b" (with a width of, for example, 5 mm) indicates the overlapping area of the projection areas 150 and 152 in the Y direction. The range "a" indicates the non-overlapping area of the projection area 150, while the range "c" indicates the non-overlapping area of the projection area 152.

In general, the imagery characteristics of a plurality of projection lens systems used in the scanning-type projection exposure system vary slightly. Suppose that the projection lens system used for image formation in the projection area 150 has an imagery characteristic that causes the image-forming position to shift $\Delta P$ in the $-Y$ direction (as indicated by the left arrow in FIG. 20(a)), and further suppose that the projection system used for image formation in the projection areas 152 has an imagery characteristic that causes the image-forming position to shift $\Delta P$ in the $+Y$ direction (as indicated by the right arrow), then overlay errors occur, as shown in FIG. 20, between the layers exposed by the projection lens systems that have characteristics different from each other. In FIG. 20, the horizontal axis represents a Y position, and the vertical axis represents an error with respect to the designated pattern-forming position in the layers. The positional errors in the areas "a" and "c" are $\Delta P$ with opposite signs, and therefore, the total offset between the areas "a" and "c" becomes $2\Delta P$. In the area "b", the exposure ratio of the projection area 150 to the area 152 changes linearly, and the offset of the formed pattern also changes linearly from $-\Delta P$ to $+\Delta P$. In this context, the area in which two projection areas are overlapped during exposure is called the "stitching portion".

If the imagery characteristics of multiple projection lens systems of a scanning-type exposure apparatus vary slightly, the magnitudes and the directions of offset of the pattern images formed through these projection lens systems also vary with respect to the stitching portion.

Generally, a plurality of scanning-type projection exposure apparatus are used in the photolithographic process, each apparatus being used to expose one of the layers of a TFT. Accordingly, the accuracy in overlaying a plurality of layers may be adversely affected by variation in the imagery characteristics of the different scanning-type projection exposure apparatus. In addition, variation in the imagery characteristics of the multiple projection lens systems provided in a scanning-type projection exposure apparatus may also affect the overlay accuracy.

FIGS. 21(a)–(c) show overlay errors in overlaid layers, which are caused when a layer of the gate line and gate electrode of a TFT and a layer of the data line and source/drain electrodes of the TFT are formed by separate scanning-type projection exposure apparatus.

FIG. 21(a) is similar to FIG. 20(a) and shows the overlapping area between the projection areas 150 and 152 in which a data line and source/drain electrodes (collectively referred to as source/drain electrodes) are formed as a first layer by the first scanning-type projection exposure apparatus. FIG. 21(b) shows the overlapping area between projection areas 154 and 156 in which a gate line and a gate electrode (collectively referred to as a gate electrode) are formed as a second layer on the glass substrate 142 by the second scanning-type projection exposure apparatus. The imagery characteristic of the projection lens system that forms a pattern image in the projection area 154 causes the image-forming position to shift $\Delta P$ in the $+Y$ direction, as indicated by the right arrow. On the other hand, the imagery characteristic of the projection lens system that forms a pattern image in the projection area 156 causes the image-forming position to shift $\Delta P$ in the $-Y$ direction, as indicated by the left arrow.

For purposes of illustration, FIGS. 21(a) and 21(b) depict the case in which the possible overlay error becomes largest because the upper layer is exposed by a projection lens system that has an imagery characteristic opposite to that of the projection lens system for exposing the lower layer.

FIG. 21(c) shows overlay errors that occur when the lower layer gate electrode is formed on the glass substrate through the second scanning-type projection exposure apparatus, and then the upper layer source/drain electrodes are formed over the lower layer through the first scanning-type projection exposure apparatus. The horizontal axis represents a Y position, and the vertical axis represents an error.

The dashed line A indicates the positional shift of the gate electrode formed in the lower layer, and the solid line B indicates the positional shift of the source/drain electrodes formed in the upper layer. The bold solid line C indicates the overlay error (C=B−A) between the gate electrode and the source/drain electrodes. The overlay error equals the offset of the upper source/drain electrodes relative to the lower gate electrode. Therefore, the overlay error of the source/drain electrodes with respect to the gate electrode becomes $-2\Delta P$ in the area a. The overlay error of the source/drain electrodes with respect to the gate electrode becomes $2\Delta P$ in the area c. The overlay error in the area b, in which the gate electrode layer and the source/drain layer overlap each other, changes linearly from $-\Delta P$ to $+\Delta P$, because the positional shifts of the gate electrode pattern and source/drain pattern change linearly, as mentioned above. Consequently, the largest possible overlay error in the area b is $4\Delta P$.

FIGS. 22(a)–(c) illustrate the aforementioned overlay error more concretely, showing the positional shift of the source/drain electrodes 138, 140 that overlap the gate electrode 136 in each TFT area of a TFT/LCD formed by the projection exposure method. FIG. 22(a) shows the overlay error of the source/drain electrodes 138, 140 with respect to the gate electrode 136 in the area "a". The dashed line indicates the originally designed pattern-forming positions of the layers. Relative to the reference positions defined by the dashed line, the formed gate electrode 136 is offset in the +Y direction, while the formed source/drain electrodes 138, 140 are offset in the −Y direction. Similarly, FIG. 22(c) shows the overlay error of the source/drain electrodes 138, 140 with respect to the gate electrode 136 in the area "c". The gate electrode 136 is formed offset in the −Y direction, while the source/drain electrodes 138, 140 are formed offset in the +Y direction. Concerning the area "b" in which the patterns formed in the areas "a" and "c" overlap each other in a stitching portion, the overlay error of the upper layer with respect to the lower layer becomes small in the vicinity of the center. Near the edge portions of the area "b", however, the overlay error in the area "b" comes close to the error rate in the area "a" or "c".

In summary, a plurality of scanning-type projection exposure apparatus are used in the ordinary exposure process for manufacturing an LCD to expose and form patterns in the respective layers. Because each layer is formed through a different exposure apparatus, the overlaying accuracy of each layer is greatly affected by variations in the imagery characteristics of different projection lens systems used in the projection exposure apparatus, or by variations in the imagery characteristics of the plurality of projection exposure apparatus used in the exposure process.

In manufacturing a TFT, if the overlapping area of the source electrode that covers the gate electrode changes, the parasitic capacitance between the source electrode and the gate electrode also changes, which further affects the characteristics of the TFT element. The change in the TFT element characteristics results in flickers or burning in the LCD screen.

It is clear from FIG. 21 that if the overlay error rate varies steeply in the stitching portion of area "b" in which two projection areas overlap each other, then the TFT element characteristics that are located on both sides of the stitching portion differ greatly from each other. Consequently, the difference will be visually recognized as unevenness or deterioration of the image quality with the stitching portion as a boundary. This phenomena is called "screen separation" or "uneven split".

SUMMARY OF THE INVENTION

This invention was conceived in view of the problems in the prior art, and it is an object of the invention to provide an exposure method, an exposure apparatus, and a mask that can reduce the extent of an artificial contrast gap that occurs in stitching portions.

It is another object of the invention to provide a projection exposure method that can prevent screen separation, which causes deterioration of the LCD image quality.

These and other aspects and advantages of the invention are achieved by providing an exposure method according to one aspect of the invention. In the exposure method, a first layer exposure pattern having a first plurality of unit patterns is formed on a photosensitive substrate, and the first plurality of unit patterns are connected through at least one first layer stitching portion. A second layer exposure pattern having a second plurality of unit patterns is formed on the photosensitive substrate overlaying the first layer exposure pattern, and the second plurality of unit patterns are connected through at least one second layer stitching portion. In forming the second layer, the second layer stitching portion is formed offset from the first layer stitching portion.

In an exposure method according to another aspect of the invention, a first layer exposure pattern having a first plurality of unit patterns is formed on a photosensitive substrate, and the first plurality of unit patterns are connected through at least one first layer stitching portion. A second layer exposure pattern having a second plurality of unit patterns is formed on the photosensitive substrate overlaying the first layer exposure pattern, and the second plurality of unit patterns are connected through at least one second layer stitching portion. A contrast between the second plurality of unit patterns overlaying the first plurality of unit patterns is smoothed in accordance with the position of the second layer overlaying the first layer. In preferred forms, the smoothing is achieved by offsetting the second layer stitching portion from the first layer stitching portion.

In accordance with still another aspect of the invention, there is provided an exposure apparatus for forming a first layer and a second layer on a photosensitive substrate. The exposure apparatus includes an illumination optical system to illuminate a mask with luminous flux emitted from a light source. A plurality of divided patterns are formed on the mask through stitching portions, wherein a stitching portion in the first layer is disposed offset from a stitching portion in the second layer. A blind is disposed in an optical path of the luminous flux and changes a dimension of an illumination area on the mask illuminated by the illumination optical system. A projection lens system is disposed in the optical path on a side or the musk opposite from the illumination optical system. The projection lens system projects the luminous flux having passed through the mask onto the photosensitive substrate. A controller communicates with the blind to control a position of the blind in accordance with the divided patterns.

In accordance with yet another aspect of the invention, a mask set including a plurality of masks for forming a first layer and a second layer on a photosensitive substrate is provided. Each of the masks includes a plurality of unit patterns formed thereon, wherein the unit patterns of one mask have different dimensions from dimensions of the unit patterns of another mask.

In an exposure method according to yet a further aspect of the invention, a portion of a first pattern is projected into one of a plurality of first projection areas on a photosensitive substrate, the first projection areas being separate from each other with adjacent projection areas overlapping each other by a predetermined overlap amount in a direction perpendicular to a scanning direction of the substrate. The first pattern and the substrate are synchronously scanned in the scanning direction relative to the plurality of first projection areas to transfer the first pattern onto the substrate. A portion of a second pattern is projected into a plurality of second projection areas disposed offset from the plurality of first projection areas in the direction perpendicular to the scanning direction by a predetermined distance within a plane defined by the substrate. The second pattern and the substrate are also synchronously scanned in the scanning direction relative to the plurality of second projection areas to transfer the second pattern onto the substrate.

If the predetermined distance (positional shift) is set so as to be greater than the width of the stitching portion, then the stitching portions of upper and lower layers are prevented from adversely affecting each other. The maximum overlay error can be reduced by half, as compared with the prior ant method. By shifting the stitching portions, the overlay error changes gently at each stitching portion, thereby preventing screen separation from being conspicuous.

BRIEF DESCRIPTION OF THE DRAWINGS

These and other aspects and advantages of the present invention will be described in detail with reference to the accompanying drawings, in which:

FIG. 1 is a side view of the exposure apparatus according to a first embodiment of the invention;

FIG. 2 is a schematic plan view showing the structure of the mask position detecting system according to the invention;

DETAILED DESCRIPTION OF PREFERRED EMBODIMENTS

Figure 3:
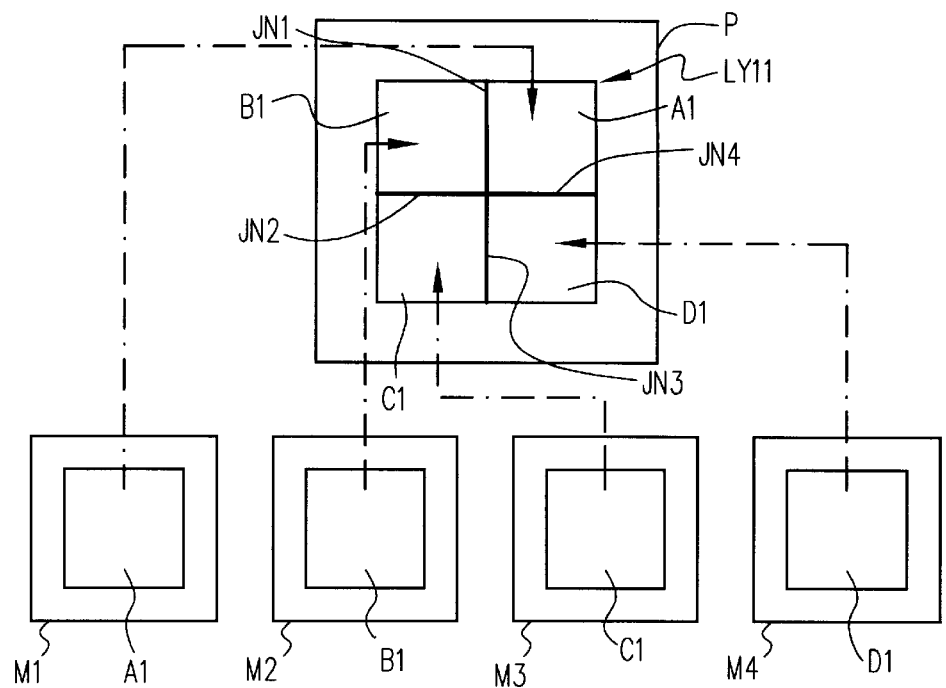
FIG. 3 is a schematic plan view used for explanation of the exposure operation for the first layer.

FIG. 1 shows the overall structure of the step-and-repeat type exposure apparatus according to a first embodiment. An illumination light source 1, such as a super-high pressure mercury-vapor lamp, excimer laser or the like, emits illumination light IL having a wavelength (exposure wavelength) that can expose a resist layer. Examples of illumination light IL include g-rays, i-rays, ultraviolet pulsed beam (e.g., FrF excimer laser beam), etc. The illumination light IL enters a fly-eye lens 2.

The fly-eye lens 2 makes the illumination light IL uniform and reduces the spectrum prior to guiding the illumination light IL to a first mirror 4. The illumination light IL is reflected by the mirror 4, passes through relay lenses 5a, 5b and is reflected by a second mirror 7. The illumination light IL reaches a main condenser lens 8 and illuminates the pattern area on the mask M1 with uniform illuminance. The fly-eye lens 2, the mirrors 4, 7, the relay lenses 5a, 5b and the main condenser lens 8 constitute the illumination optical system.

A variable blind (field stop) 6 is positioned between the relay lens 5a and the relay lens 5b and is driven by a variable blind driving unit 6a so as to block an area outside of the pattern area on the mask M1, whereby illumination light IL illuminates only the pattern area of the mask M1. The blocked area is defined by the pattern areas formed on the respective masks M1–M4.

The illumination light IL, which has illuminated the pattern area of mask M1, penetrates the mask M1, passes through a projection lens system PL, and forms a pattern image of the mask M1 on the photosensitive substrate P. A light beam reflected by the photosensitive substrate P passes through the mirror 4 and enters the photodetector (reflection monitor) 3. The photodetector 3 photoelectrically detects the quantity of reflected light and outputs optical information (e.g., intensity) PS to a controller 12. The optical information PS is used to obtain fluctuation in the imagery characteristic of the projection lens system PL.

The mask stage MS, which serves as a mask holder, is supported on a base 21 and is movable in the direction A on the base 21. A plurality of mask tables MT are positioned on the mask sage MS, each of which supports one of the masks M1, M2, M3 and M4, respectively.

A leveling holder 17a holds the photosensitive substrate P through a known adsorption mechanism (not shown). A Z-leveling stage 17b is positioned under the leveling holder 17a and moves in the Z direction. An XY stage 17C is positioned under the Z stage 17b and moves in the X and Y directions.

One of the masks M1–M4 on the mask tables MT is registered under the illumination light IL so as to cross the optical axis AX of illumination light IL. The height (vertical position) and the inclination of the registered mask are measured by sets of detection light emitting units 11a and light receiving units 11b. The detection light emitting unit 11a emits detection light (laser beam) AL to a reference surface of the registered mask (M1). The light receiving unit 11b receives, through a parallel planar glass 20, the reflected detection light AL that was reflected from the reference surface of the mask.

The detection light emitting unit 11a and the detection light receiving unit 11b are positioned so that the distance from the projection lens system is constant. The level of the detection light AL received by the detection light receiving unit 11b corresponds to the distance between the mask pattern and the projection lens system.

FIG. 2 illustrates an arrangement of the detection light emitting units and detection light receiving units for detecting the height and the inclination of the mask. A first detection system includes a detection light emitting unit 11a and a detection light receiving unit 11b, a second detection system includes a detection light emitting unit 11a' and a detection light receiving unit 11b', a third detection system includes a detection light emitting unit 18a and a detection light receiving unit 18b, and a fourth detection system includes a detection light emitting unit 18a and a detection light receiving unit 18b'.

The four pairs of the detection systems detect the height of four points P1–P4 in the mask M1 (or one of M2–M4). Based on the detection result, displacement, if necessary, in the height and the inclination from the optical axis AX are determined with respect to a reference position.

To detect the height in the Z direction of the photosensitive substrate P mounted on the leveling holder 17a, a horizontal position detection system (13a, 13b) and a focal point detection system (14a, 14b) are provided. Light sources 13a and 14a emit illumination light that strikes the surface of the photosensitive substrate from an oblique direction with respect to the optical axis AX. Light receiving units 13b and 14b receive the light reflected from the surface of the photosensitive substrate P. Half mirrors 31 and 32 are positioned on the optical path, and a parallel planar glass 30 is positioned in front of the receiving unit 14b. An image-forming luminous flux of the illumination light emitted from the light source 13a forms a pin-hole image or a slit image.

A plate controller 15 controls a leveling driving unit 16a and a Z-axis driving unit 16b based on photodetection signals S1 and S2 that are supplied from the receiving units 13b and 14b. The driving units 16a and 16b drive the leveling holder 17a and the Z-axis stage 17b, respectively, under the control of the plate controller 15 to adjust the position of the photosensitive substrate P by adjusting the height in the Z direction and the inclination with respect to the optical axis AX, thereby positioning the photosensitive substrate P in the optimum image-forming plane of the projection lens system PL.

The plate controller 15 also controls the XY stage 17c based on a direction from the controller 12, which will be described below.

In this embodiment, the angle of the parallel planar glass 30 is adjusted in advance so that the optimum image-forming plane becomes the zero level in order to calibrate the focal point detection system. At the same time, the horizontal position detection system is also calibrated so that when the photosensitive substrate P is aligned with the image-forming plane, the parallel luminous flux from the light source 13a is focused on the center of the light-receiving element, which is divided into four sections and forms part of the light-receiving unit 13b.

The controller 12 controls the overall exposure apparatus as well as the variable blind driving unit 6a, the mask stage MS and the plate controller 15. The controller 12 sets the illumination area by changing the size of the aperture of the variable blind 6 through the variable blind driving unit 6a corresponding to pattern data of the masks M1–M4. The controller 12 determines the position of the mask through the mask stage MS based on alignment data of the masks M1–M4 detected by the alignment optical system (not shown). The controller 12 also directs the plate controller 15 to control the position of the XY stage 17c in a stepwise manner based on the mask pattern data.

The controller 12 supplies the detected displacement of the mask M1 (or is one of M2–M4) with respect to the height and the inclination relative to the optical axis AX to the plate controller 15. The plate controller 15 then drives the leveling holder 17a and the Z stage 17b through the driving units based on the displacement so that the photosensitive substrate P is positioned in a conjugate position with respect to the mask M1 (or one of M2–M4).

FIG. 3 illustrates a plurality of masks M1–M4 mounted on the mask stage MS, which are successively aligned with the optical axis AX by the controller 12. The respective patterns (referred to as unit patterns) formed on the masks M1–M4 are successively exposed onto the predetermined areas on the photosensitive substrate P. The controller 12 sets the aperture of the variable blind 6 through the variable blind driving unit 6a based on the mask pattern data. The controller 12 repeatedly moves and stops the photosensitive substrate P, through the plate controller 15, to expose the unit pattern A1 formed on the mask M1. The controller 12 then transfers the unit pattern B1 formed on the mask M2 onto the photosensitive substrate P adjacent the unit pattern A1. The unit patterns A1 and B1 transferred onto the photosensitive substrate P are connected through stitching JN1.

The controller 12 further controls the plate controller 15 to transfer the unit pattern C1 formed on the mask M3 onto the photosensitive substrate P adjacent the unit pattern B1, and the unit patterns B1 and C1 transferred onto the photosensitive substrate P are connected with each other through stitching JN2. Similarly, the unit pattern D1 formed on the mask M4 is transferred adjacent the unit pattern C1. The transferred unit patterns C1 and D1 are coupled through stitching JN3. The unit pattern D1 is further connected to the unit pattern A1 through stitching JN4.

In this manner, the unit patterns A1, B1, C1 and D1 of the masks M1–M4 are successively exposed onto the photosensitive substrate P so that the unit patterns A1–D1 are connected through stitching JN1–JN4. These divided areas form a layer (the first layer designated LY11). Each of the unit patterns A1–D1 has an overlap area. The projection image in the overlap area of a unit pattern is combined with the projection image in the overlap area of another unit pattern, thereby connecting the unit patterns at the stitching portions JN1–JN4. The width of the overlapped (double-exposed) area is preferably about 2 μm.

Figure 4:
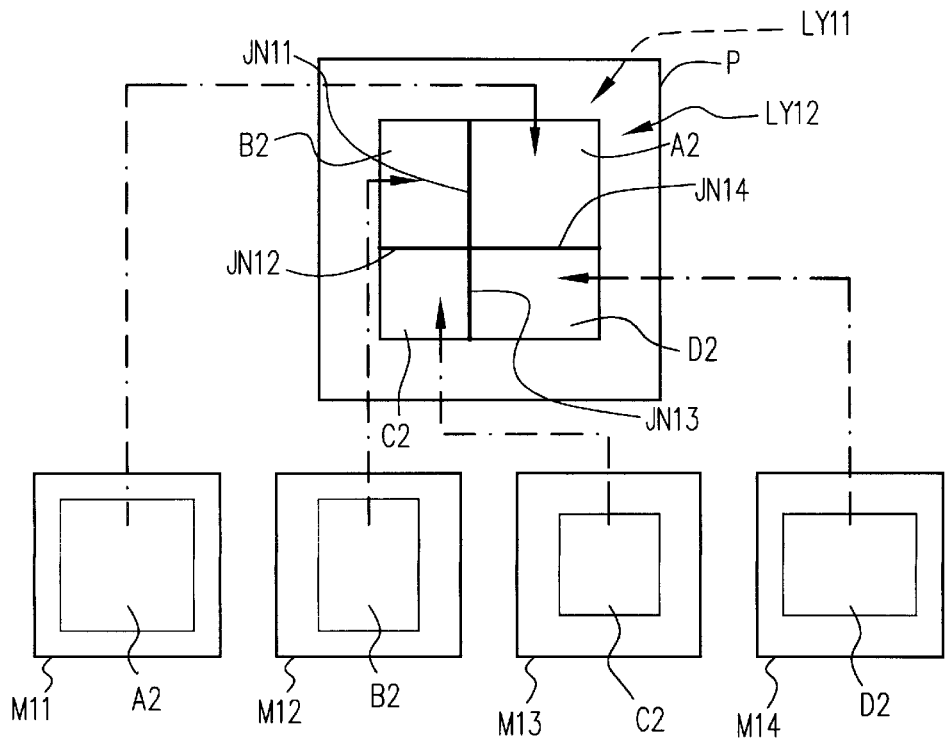
FIG. 4 is a schematic plan view used for explanation of the exposure operation for the second layer.

The controller 12 changes the masks on the mask stage MS and transfers the second layer on the photosensitive substrate P on which the first layer image has been formed, using masks M11, M12, M13, M14 for the second layer, as shown in FIG. 4. The controller 12 successively aligns the plurality of masks M11, M12, M13, M14 mounted on the mask stage MS with the optical axis AX, and successively exposes the patterns formed on the masks M11–M14 (unit patterns) onto the photosensitive substrate P on which the first layer LY11 has been formed. The controller 12 controls the variable blind driving unit 6a and the plate controller 15 so as to expose the unit pattern A2 formed on the mask M11 onto the photosensitive substrate P. The unit pattern B2 formed on the mask M12 is then transferred onto the photosensitive substrate P adjacent the unit pattern A2, and the unit patterns A2 and B2 transferred on the photosensitive substrate P are connected with each other through stitching JN11.

The controller 12 then controls the variable blind driving unit 6a and the plate controller 15 so as to expose the unit pattern C2 formed on the mask M13 onto the photosensitive substrate P adjacent the unit pattern B2, and the unit patterns B2 and C2 transferred on the photosensitive substrate P are connected with each other through stitching JN12. The unit pattern D4 formed on the mask M14 is then transferred adjacent the unit pattern C2, and the unit pattern C2 is connected to the unit pattern D2 through stitching JN13. Finally, the unit pattern D2 is connected to the unit pattern A2 through stitching JN14.

In this manner, the unit patterns A2, B2, C2 and D2 of the masks M11–M14 are successively exposed onto the photosensitive substrate P on which the first layer LY11 has been formed, thereby forming the second layer (the second layer designated LY12) including the unit patterns A2, B2, C2 and D2 connected to one another through stitching JN11, JN12, JN13 and JN14.

Figure 5:
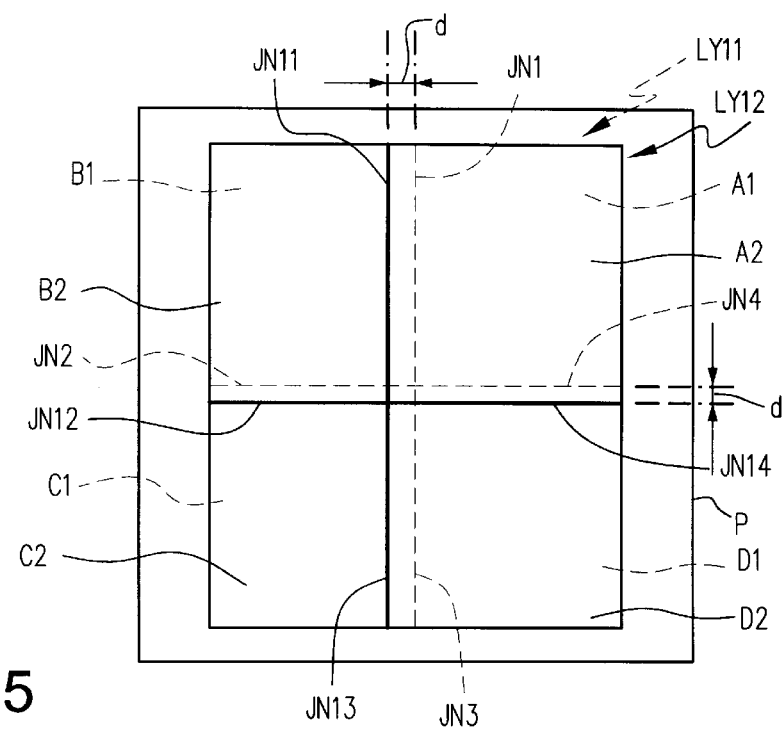
FIG. 5 is a plan view showing stitching portions in the first and second layers formed on the photosensitive substrate.

The dimensions of the unit patterns A2, B2, C2 and D2 formed on the masks M11, M12, M13 and M14 for the second layer LY12 are different from those of the unit patterns A1, B1, C1 and D1 formed on the masks M1, M2, M3 and M4 for first layer LY11. Consequently, the stitching portions JN11–JN14 in the second layer LY12 are offset from the stitching portions JN1–JN4 in the first layer LY11 by a displacement amount d (2 mm in this embodiment), as shown in FIG. 5.

Figure 6:
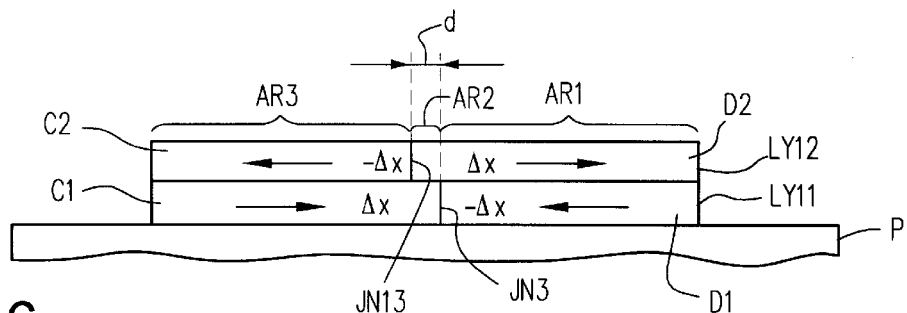
FIG. 6 is a cross-sectional view showing stitching portions in the first and second layers.

FIG. 6 shows the cross-sections of the first layer LY11 and the second layer LY12 formed on the photosensitive substrate P. The unit patterns D1 and C1 are connected with each other through stitching JN3 in the first layer LY11. In the second layer LY12, which is formed over the first layer LY11, the unit patterns D2 and C2 are connected with each other through stitching JN13. The stitching JN13 in the second layer LY12 is offset from the stitching JN3 in the first layer LY11 by a distance "d".

If the unit pattern D1 in the first layer LY11 is transferred with an offset $-\Delta x$ from the target exposure position, and if the unit pattern D2 in the second layer LY12 is transferred with an offset $+\Delta x$ from the target exposure position, then the overlay error of the unit pattern D2 in the second layer LY12 becomes $+2\Delta x$ relative to the unit pattern D1 in the first layer LY11.

Figure 7:
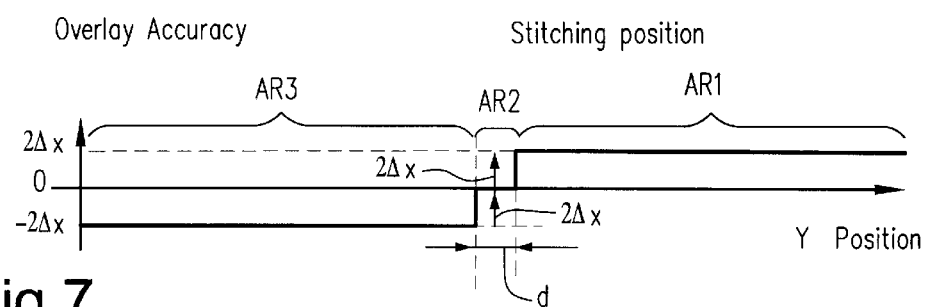
FIG. 7 illustrates an example of overlay error that varies throughout the stitching portion.

If the unit pattern C1 in the first layer LY11 is transferred with an offset $+\Delta x$ from the target exposure position, and if the unit pattern C2 in the second layer LY12 is transferred with an offset $-\Delta x$ from the target exposure position, then the overlay error of the unit pattern C2 in the second layer LY12 becomes $2\Delta x$ relative to the unit pattern C1 in the first layer LY11. Accordingly, the overlay error of the second layer LY12 relative to the first layer LY11 becomes $2\Delta x$ in the first area AR1 in which the unit pattern D2 of the second layer LY12 covers the unit pattern D1 of the first layer LY11, while it becomes $-2\Delta x$ in the third area AR3 in which the unit pattern C2 of the second layer LY12 covers the unit pattern C1 of the first layer LY11, as shown in FIG. 7.

Because the stitching portion JN13 in the second layer is formed offset from the stitching portion JN3 in the first layer by a distance d, the overlapped area (second area) AR2 with a width d is formed between the first area AR1 and the third area AR3, in which the unit pattern D2 of the second layer LY12 overlaps the unit pattern C1 of the first layer LY11. In the second area AR2, the unit pattern C1 in the first layer LY11 is offset $+\Delta x$ from the target position, and the unit pattern D2 in the second layer LY12 is offset $+\Delta x$ from the target position. As a result, the overlay error between the first layer and second layer becomes zero in the second area AR2.

In the aforementioned case, the unit patterns D1 and C1 were exposed in the first layer LY11 offset in opposite directions, and the unit patterns D2 and C2 were exposed in the second layer LY12 offset in opposite directions, and an error occurs in the exposure position such that the difference between the overlay error in the first area AR1 and the overlay error in the third area AR3 is maximized.

However, since the second area AR2 is defined by shifting the stitching portion JN13 of the second layer LY12 from the position of the stitching portion JN3 of the first layer LY11 by a distance d, the resultant patterns in the first layer LY11 and the second layer LY12 offset in the same direction in the second area AR2. As a result, the overlay error between the first and second layers LY11 and LY12 is canceled out in the second area AR.

Figure 8:
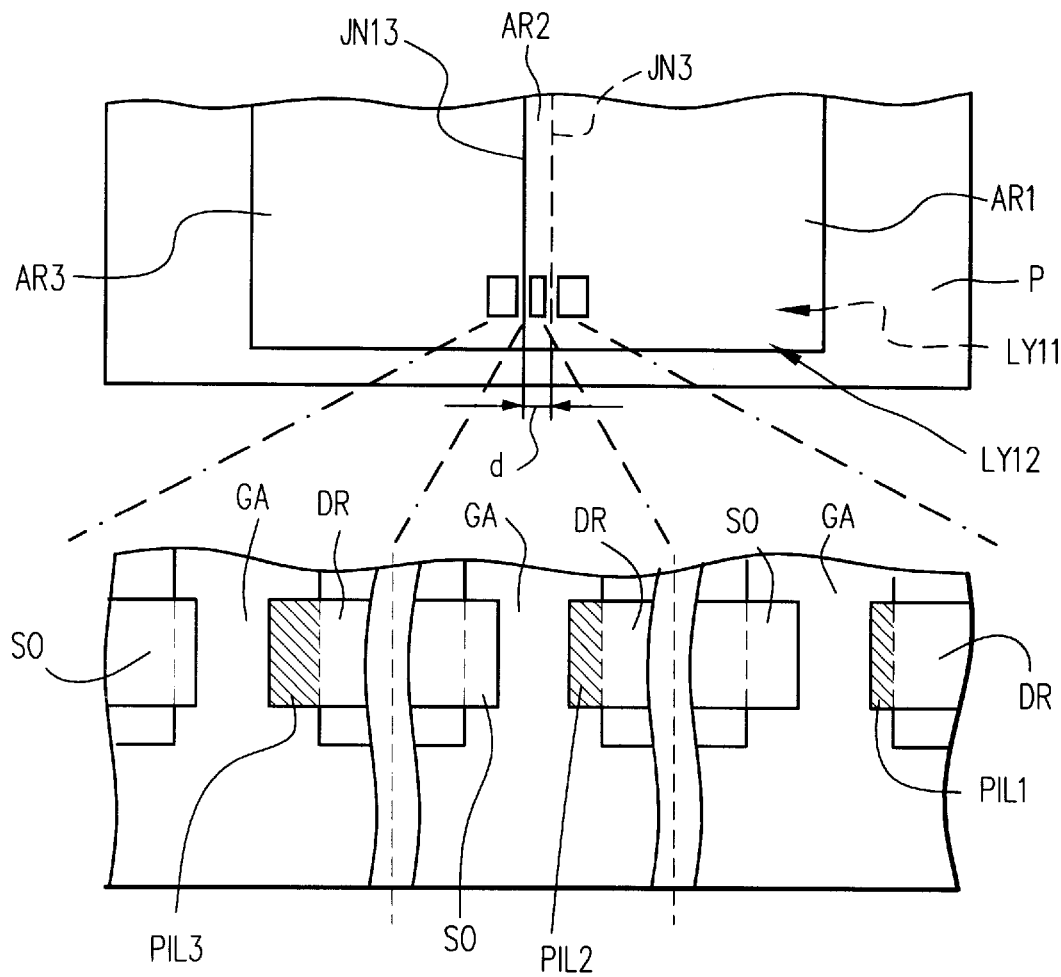
FIG. 8 is a schematic plan view showing variation in the overlapping area of the source or drain electrode, which is caused by the overlay error.

The difference between the overlay error in the second area AR2 and the overlay error in the first area AR1 becomes $2\Delta x$, and the difference between the overlay error in the second area AR2 and the overlay error in the third area AR3 also becomes $2\Delta x$. FIG. 8 illustrates the overlapping areas (PIL1, PIL2, PIL3) of the drains DR formed in the second layer LY12 over the gates GA formed in the first layer LY11 in thin film transistors. The overlapping area is minimized in the first area AR1 (PIL1), while being maximized in the third area AR3 (PIL3). The overlapping area PIL2 in the second area AR2 is in-between. In other words, an area having all intermediate contrast level (the second area AR2) is formed between the first area AR1 and third area AR3, which have a large amount of contrast gap.

In contrast with the case in which the first area AR1 is directly connected to the third area AR3, the change in the contrast becomes smooth, and the contrast gap is prevented from being conspicuous in each unit pattern.

In this embodiment, the maximum differential of overlay (i.e., the maximum difference between the overlay errors of adjacent unit patterns on the photosensitive substrate) becomes almost half of that with the conventional method.

In this embodiment, a unit pattern is formed in a mask, and a plurality of masks are successively aligned with the optical axis AX of the projection lens system PL for exposure; however, the invention is not limited to this arrangement, and a plurality of unit patterns may be formed in a mask. If this is the case, a necessary unit pattern is defined by the variable blind 6 and separately exposed.

Figure 9:
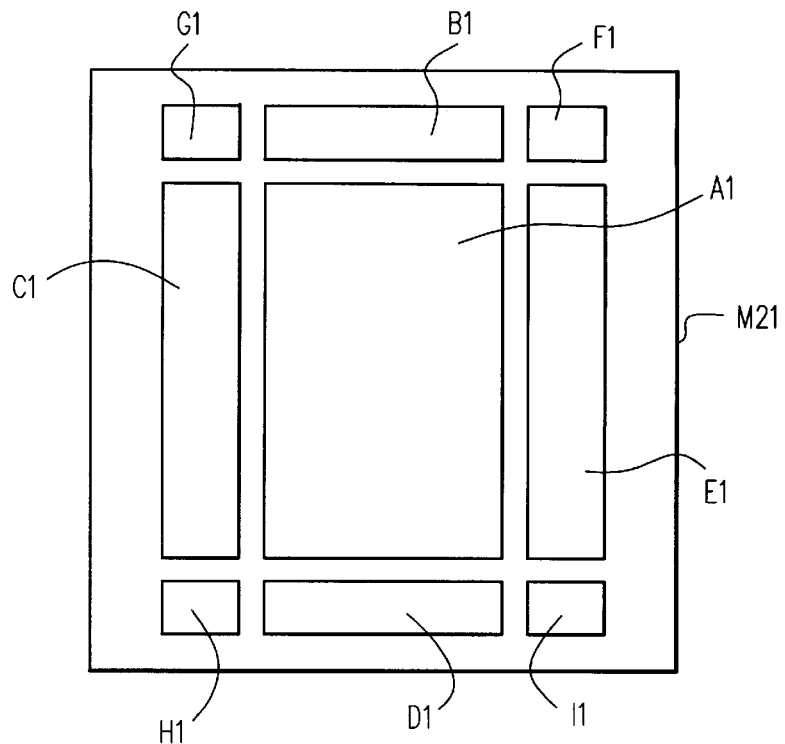
FIG. 9 is a plan view of a mask in which a plurality of unit patterns are formed.
Figure 10:
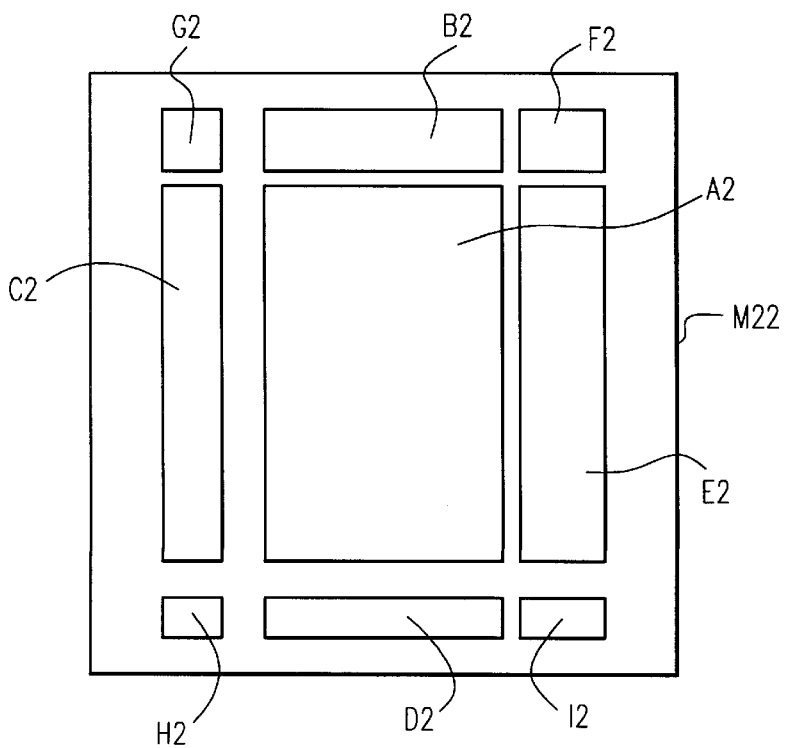
FIG. 10 is a plan view of a modification of the mask in which a plurality of unit patterns are formed.
Figure 11:
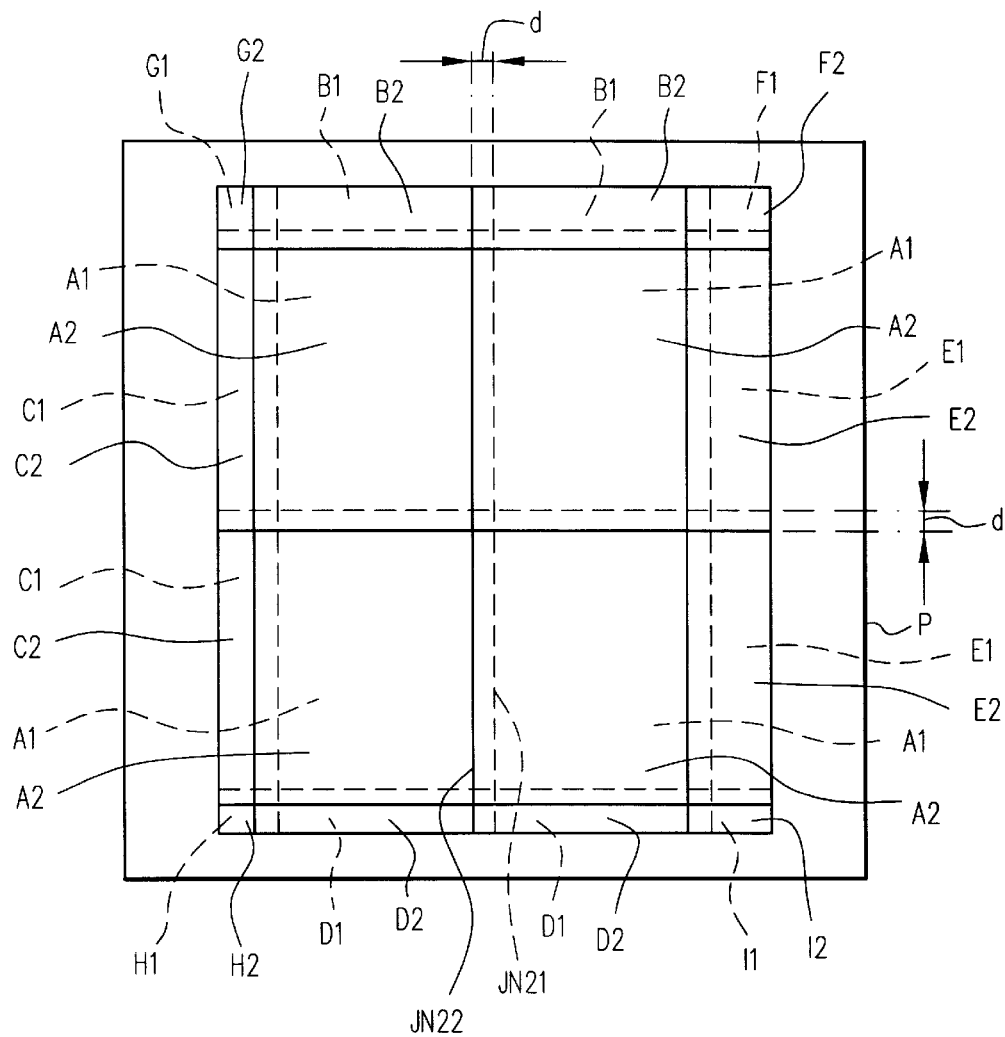
FIG. 11 is a schematic plan view showing stitching portions on a photosensitive substrate.

FIG. 9 illustrates a mask M21 on which first layer unit patterns A1, B1, C1, D1, E1, F1, G1, H1 and I1 are formed. The first pattern layer is exposed onto a photosensitive layer using the mask M21, then the second pattern layer is exposed over the first layer using a mask M22 (shown in FIG. 10). The dimensions and arrangement of the unit patterns A2, B2, C2, D2, E2, F2, G2, H2 and I2 of the second layer mask M22 are slightly different from those or the unit patterns A1, B1, C1, D1, E1, F1, G1, H1 and I1 of the first layer mask M21. Consequently, the stitching portion JN22 of the unit patterns in the second layer is offset from the position of the stitching portion JN21 of the first layer by a distance d, as shown in FIG. 11.

Similar to the embodiment shown in FIG. 5, the contrast gap that occurs at the stitching portions JN21 and JN22 between two adjacent unit patterns can be reduced. In this embodiment, an exposure apparatus that aligns a single mask with the optical axis AX and illuminates a necessary unit pattern using a variable blind 6 may be used in place of the exposure apparatus of FIG. 1, which has a mask stage MS.

Although the offset of the stitching portions between the first and second layers is set to 2 mm, the offset amount is not limited to this value. According to experimental data, an offset d of at least 1.5 mm can sufficiently reduce the contrast gap in practical use.

In the above-described embodiment, a single projection lens system PL is used in the exposure apparatus; however, a scanning-type exposure apparatus, which has a plurality of projection lens systems, may be used.

Although two layers (LY11, LY12) are formed photosensitive substrate, the invention is not limited to two-layer exposure. The invention can be broadly applied to cases in which three, four or more layers are formed, as long as the stitching portions of different layers offset from one another.

A second embodiment of the invention will be described with reference to FIGS. 12–14.

Figure 12:
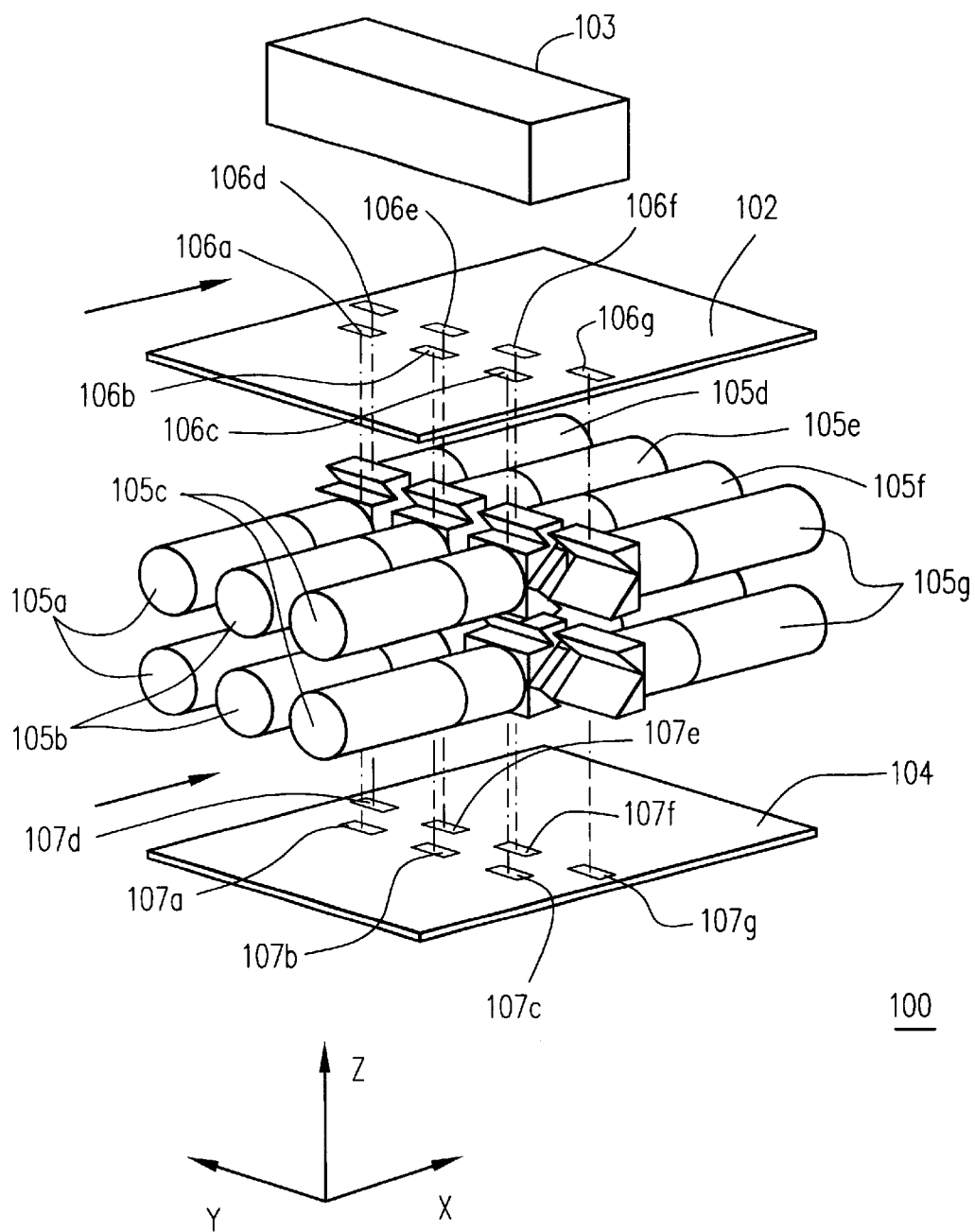
FIG. 12 is a perspective view of the scanning-type projection exposure apparatus according to a second embodiment of the invention.

FIG. 12 illustrates an example of a projection exposure apparatus used in the projection exposure method according to the second embodiment. FIG. 12 is a perspective view of a scanning-type projection exposure apparatus 100 having a plurality of projection lens systems and forming an erecting positive image with a magnification of one as a whole. In FIG. 12, the coordinate system is defined such that the X axis extends along the direction that a reticle 102, on which a predetermined circuit pattern is formed, and a glass substrate 104 coated with resist are driven, the Y axis extends perpendicular to the X axis within the plane of the reticle 102, and the Z axis extends vertical to the reticle 102. An illumination optical system 103 uniformly illuminates a reticle 102 positioned in the XY plane. The illumination optical system 103 has a trapezoid field stop (not shown) so that adjacent optical pattern images overlap each other by a predetermined amount. The illumination optical system 103 makes luminous flux emitted by the light source (not shown) uniform through the lens system, which includes a fly-eye lens. The luminous flux is then shaped by the field stop so as to have a trapezoid profile and illuminates the circuit pattern on the reticle. The projection exposure area on the reticle 102 becomes trapezoid-shaped.

The reticle 102 is mounted on the reticle stage (not shown) and moves in the X and Y directions along with the movement of the reticle stage. A plurality of projection lens systems 105a–105g are positioned under the reticle 102, each of the projection lens systems being located so as to correspond to one of the apertures of the field stops. Each of the projection lens systems 105a–105g is preferably constituted by pairs of Dyson optical systems. The projection optical systems 105a–105g, each having two Dyson optical systems, are arranged in two rows (upper row and lower row) so that the projection lens systems 105A, 105B, 105C and the projection lens systems 105D, 105E, 105F, 105G are alternately positioned.

When illumination light 106a–106g having a trapezoid profile is guided onto the reticle 102, the patterns on the reticle 102 are exposed in the trapezoid projection areas 107a–107g through the projection lens systems 105a–105g. The glass substrate 104 is mounted on the X-Y stage (not shown) and moves in the X and Y directions along with the movement of the X-Y stage.

The reticle stage and the X-Y stage are synchronously moved in the X direction relative to the projection lens system, thereby transferring the pattern of the reticle 102 onto the glass substrate 104 with uniform exposure distribution over the entire area Because the scanning-type projection exposure apparatus 100 has a plurality of projection lens systems 105a–105g, a large exposure area can be ensured without increasing the exposure area of each projection lens system.

Figure 13:
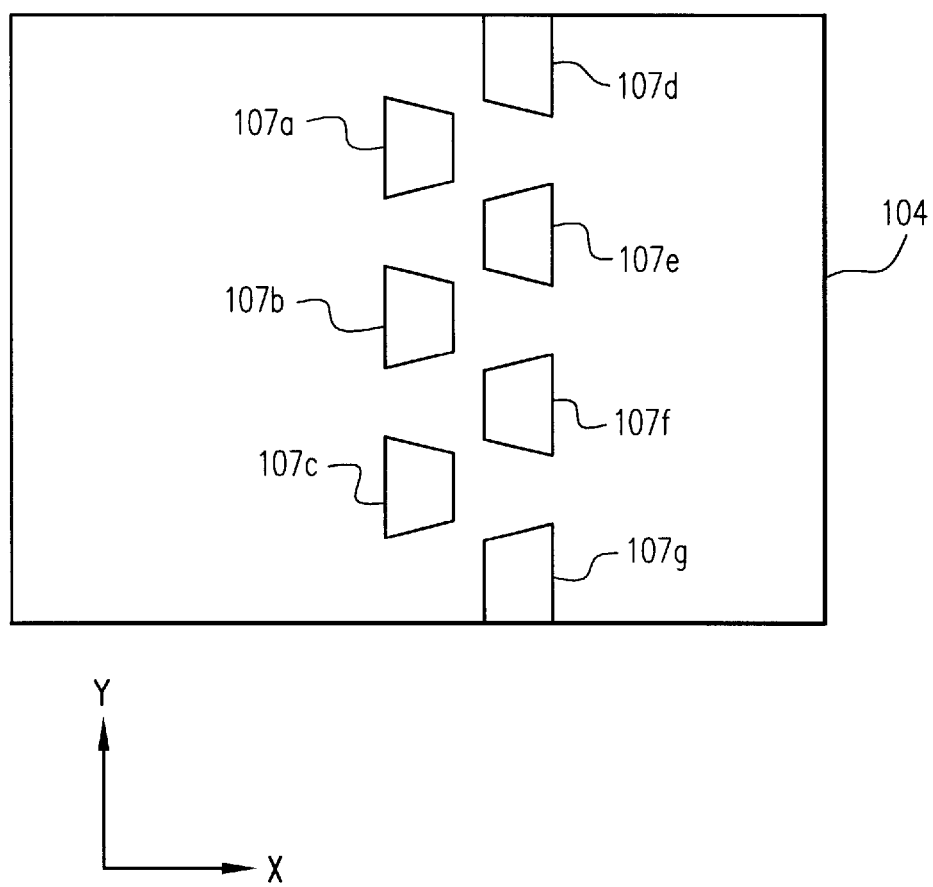
FIG. 13 illustrates projection areas projected onto a glass substrate.
Figure 14:
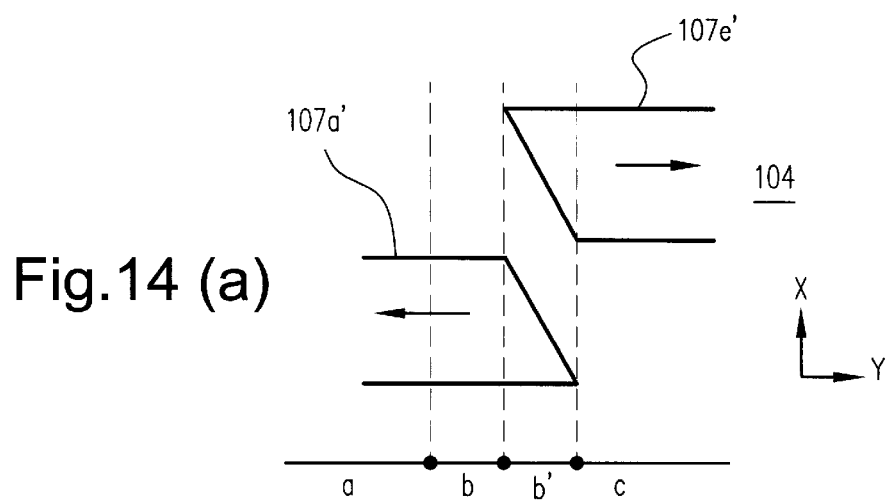
FIGS. 14(a)–(c) show how projection areas overlap each other and the resultant overlay error according to the projection exposure method of a second embodiment.

FIG. 13 is a plan view of the glass substrate 104 in which the exposure projection areas 107a–107g are formed through the projection lens systems 105a–105g. The projection areas 107a–107g are formed in a trapezoid shape so that the sum of the widths of the projection areas 107a–107g along the scanning direction (X direction) becomes constant at any Y position. The projection areas 107a–107g are arranged alternately in two columns so that the top of the trapezoids of one column are disposed facing a direction opposite to that of the trapezoids of the other columns. The trapezoids in the two columns are also arranged so that the Y positions of the trapezoids in one column overlap the Y positions of the trapezoids in the other column by a predetermined amount (e.g., 5 mm). When the glass substrate 104 is exposed, the total exposure amount of the overlapped portions of the projection areas 107a–107g becomes equal to the exposure amount of the other portions, which do not overlap in the Y direction. Accordingly, the exposure distribution becomes uniform over the entire area of the glass substrate 104. Although, in this embodiment, the shape of the projection areas 107a–107g is trapezoid, it is not limited to a trapezoid. For example, the projection area may be hexagonal. A plurality of the scanning-type projection exposure apparatus 100 are used for exposure, each being used to form one of the pattern layers of a TFT.

The projection exposure method according to the second embodiment will be described in conjunction with FIGS. 14(a)–(c), using an example in which a gate electrode layer and a source/drain electrode layer are formed. The scanning-type projection apparatus and the associated elements used for forming the gate electrode layer bear the same symbols as in FIG. 12, and another scanning-type projection exposure apparatus and the associated elements used for forming the source/drain electrode layer bear symbols with the designation (') to clarify the explanation. The same applies to the projection areas 107a–107g shown in FIG. 13.

A reticle 102 on which a gate electrode pattern is formed is mounted on the reticle stage (not shown) in the scanning-type exposure apparatus 100 used for forming a lower layer (gate electrode). The pattern image is divided into a plurality of sections by the projection lens systems 105a–105g, which are then projected into the projection areas 107a–107g (FIG. 13) formed on the resist layer (not shown), which covers the glass substrate 104.

The reticle 102 and the glass substrate 104 are synchronously moved relative to the projection lens systems 105a–105g, so that the entire area of the gate electrode pattern is uniformly exposed onto the resist layer of the glass substrate 104.

Figure 14B:
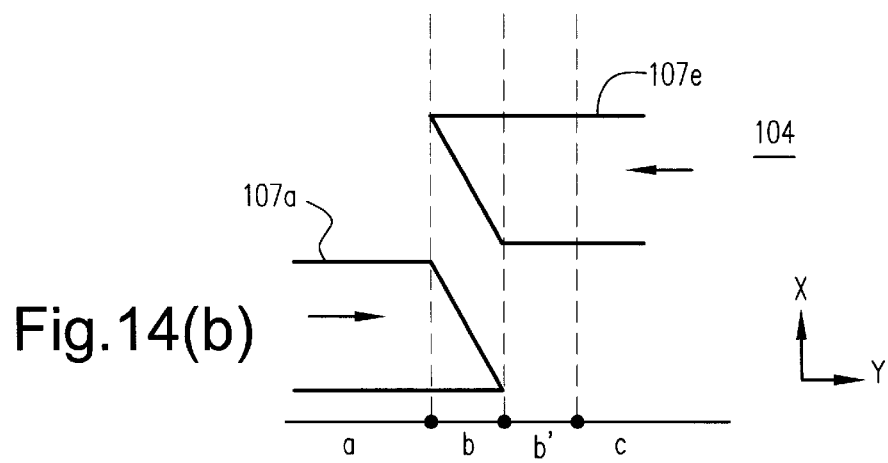

FIG. 14(b) shows the projection areas 107a and 107e formed on the glass substrate 104 by the scanning-type projection exposure apparatus 100, which overlap each other in the Y direction. In FIG. 14(b), the projection lens system 105a, which forms a pattern image in the projection area 107a, has an imagery characteristic that causes the image-forming position to shift ΔP in the +Y direction. The projection lens system 105e, which forms a pattern image in the projection area 107e, has an imagery characteristic that causes the image-forming position to shift ΔP in the −Y direction.

The resist layer is developed after the exposure and is then used as a mask for patterning the lower metal interconnect layer, thereby forming a gate electrode.

Subsequently, a gate insulation film, a channel layer and the like are formed, and another scanning-type projection exposure apparatus 100' (different from the exposure apparatus 100 used for forming the gate electrode) is used to form source/drain electrodes defining an upper layer. A reticle 102' on which a source/drain electrode pattern is formed is mounted on the reticle stage (not shown). The source/drain electrode pattern formed in the reticle 102' and the glass substrate 104 are shifted by a predetermined distance in the Y direction relative to the multiple apertures of the field stop (not shown) of the illumination optical system 103' and the multiple projection lens systems 105a'–105g,' which are provided corresponding to the apertures. The Y direction is perpendicular to the optical axes of the projection lens systems 105a'–105g' and to the moving direction of the reticle 102' and the glass substrate 104. Assuming that the source/drain electrode pattern is formed in the reticle 102' at substantially the same position as that of the gate electrode pattern formed in the reticle 102, the reticle stage of the scanning-type projection exposure apparatus 100', which supports the reticle 102', is moved so that the position of the reticle 102' shifts in the Y direction by the predetermined distance from the position of the reticle 102 that was mounted on the reticle stage of the scanning-type projection exposure apparatus 100. At the same time, the X-Y stage that supports the glass substrate 104 is also moved in the Y direction by the predetermined distance.

The pattern image of the reticle 102' is divided into a plurality of sections by the projection lens systems 105a'–105g', which are then projected into the projection areas 107a'–107g' on the resist layer (not shown) covering the glass substrate 104.

FIG. 14(a) shows the projection areas 107a' and 107e' formed on the glass substrate 104 by the scanning-type projection exposure apparatus 100', which overlap each other in the Y direction.

As shown in FIG. 14(a), the projection lens system 105a', which forms a pattern image in the projection area 107a', has an imagery characteristic that causes the image-forming position to shift ΔP in the −Y direction, and the projection lens system 105e', which forms a pattern image in the projection area 107e', has an imagery characteristic that causes the image-forming position to shift ΔP in the +Y direction.

Because the reticle 102' and the glass substrate 104 are shifted a predetermined distance relative to the projection lens systems 105a'–105g', the projection areas 107a' and 107e' for the source/drain electrode overlap each other in the Y direction in the area b'. The overlapping area b' shifts in the Y direction from the overlapping area b, in which the gate electrode projection areas 107a and 107e overlap each other by the predetermined distance. In this embodiment, the predetermined distance is equal to the width of the overlapping area b' for the projection areas 107a' and 107e'.

The reticle 102' and the glass substrate 104 are then synchronously moved in the X direction relative to the projection lens systems 105a'–105g' to expose the entire area of the source/drain electrode pattern onto the resist layer of the glass substrate 104. The resist layer is developed after the exposure and is then used as a mask for patterning the metal interconnect layer to form source/drain electrodes.

Figure 14C:
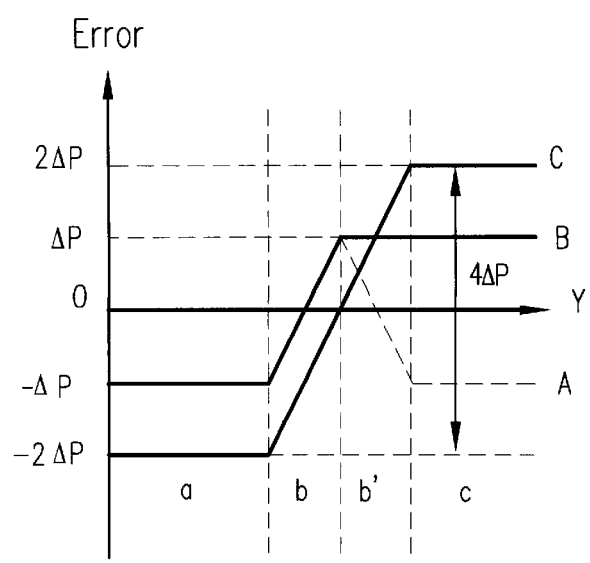

FIG. 14(c) shows the overlay error between the gate electrode layer and the source/drain electrode layer. The horizontal axis represents a Y position, and the vertical axis represents an error.

The dashed line A indicates the positional shift of the gate electrode formed in the lower layer, and the solid line B indicates the positional shift of the source/drain electrodes formed in the upper layer. The bold solid line C indicates the overlay error (C=B−A) between the gate electrode and the source/drain electrodes. The overlay error equals the offset of the upper source/drain electrodes relative to the lower gate electrode. Therefore, the overlay error of the source/drain electrodes with respect to the gate electrode becomes −2ΔP in the area a. The overlay error of the source/drain electrodes with respect to the gate electrode becomes 2ΔP in the area c.

The stitching portion (area b) of the gate electrode layer and the stitching portion (area b') of the source/drain electrode layer are adjacent each other, but do not overlap each other. Accordingly, the overlay error changes from −2ΔP to zero (0) in the area b, corresponding to the positional shift of the gate electrode. Similarly, the overlay error changes from zero (0) to +2ΔP in the area b', corresponding to the positional shift of the source/drain electrode. The total change of the overlay error in the areas b+b' becomes 4ΔP. In this embodiment, the position of the stitching portion in tie upper layer (i.e., the source/drain layer) is offset from the position of the stitching portion in the lower layer (i.e., the gate electrode layer) by a distance equal to the width of the stitching portion. Accordingly, the change of the overlay error in the stitching portion can coincide with the change in error in the positional error of the stitching portion. Although the largest possible error is 4ΔP, which is the same as in the prior art, the rate of change (i.e., the slope of the bold line C) in the TFT characteristic at the stitching portion becomes one half (½) of the prior art method, because the width of the area in which the overlay error changes is doubled. Several TFTs are formed between two TFTs that have different characteristics, so that the TFT characteristics change gradually. As a result, the screen separation caused by the variation in the imagery characteristics of the projection lens systems can be considerably reduced.

The scanning-type exposure apparatus according to a third embodiment of the invention will now be described referring to FIGS. 15(a)–(c). The structure of the exposure apparatus of this embodiment is the same as that of the second embodiment, and the explanation thereof will be omitted. The imagery characteristic of each projection lens system used in the exposure apparatus is also the same as that shown in FIG. 14.

Figure 15:
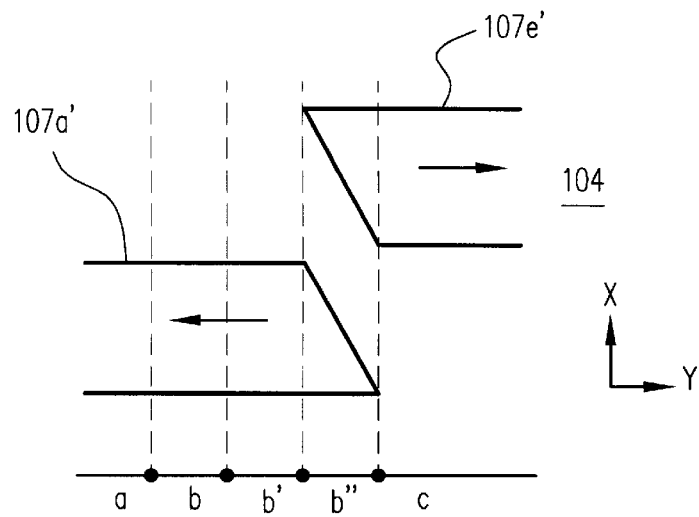
FIGS. 15(a)–(c) show how projection areas overlap each other and the resultant overlay error according to the projection exposure method of a third embodiment.
Figure 15B:
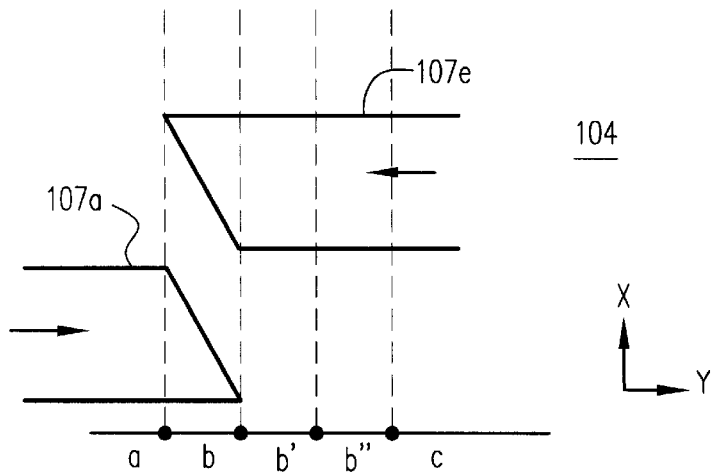

FIGS. 15(a) and 15(b) show the positional relationship among the projection areas 107a', 107e' for source/drain electrodes and the projection areas 107a, 107e for gate electrodes. In this embodiment, the positional shift of the projection areas 107a' and 107e' in the Y direction, with respect to the position of the projection area 107a and 107e, is set to b'+b", which is greater than that of the second embodiment. Each of the widths of the area b' and the area b" is equal to that of the stitching portion b.

Figure 15C:
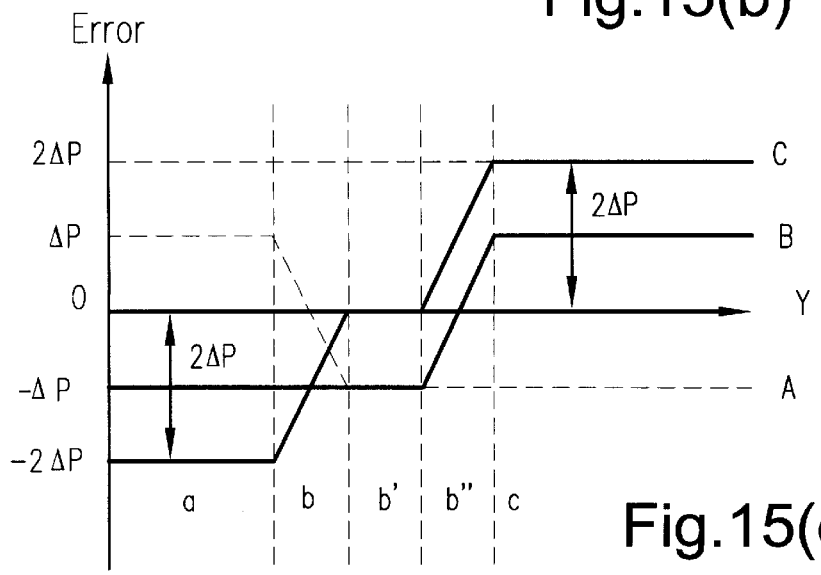
Figure 16:
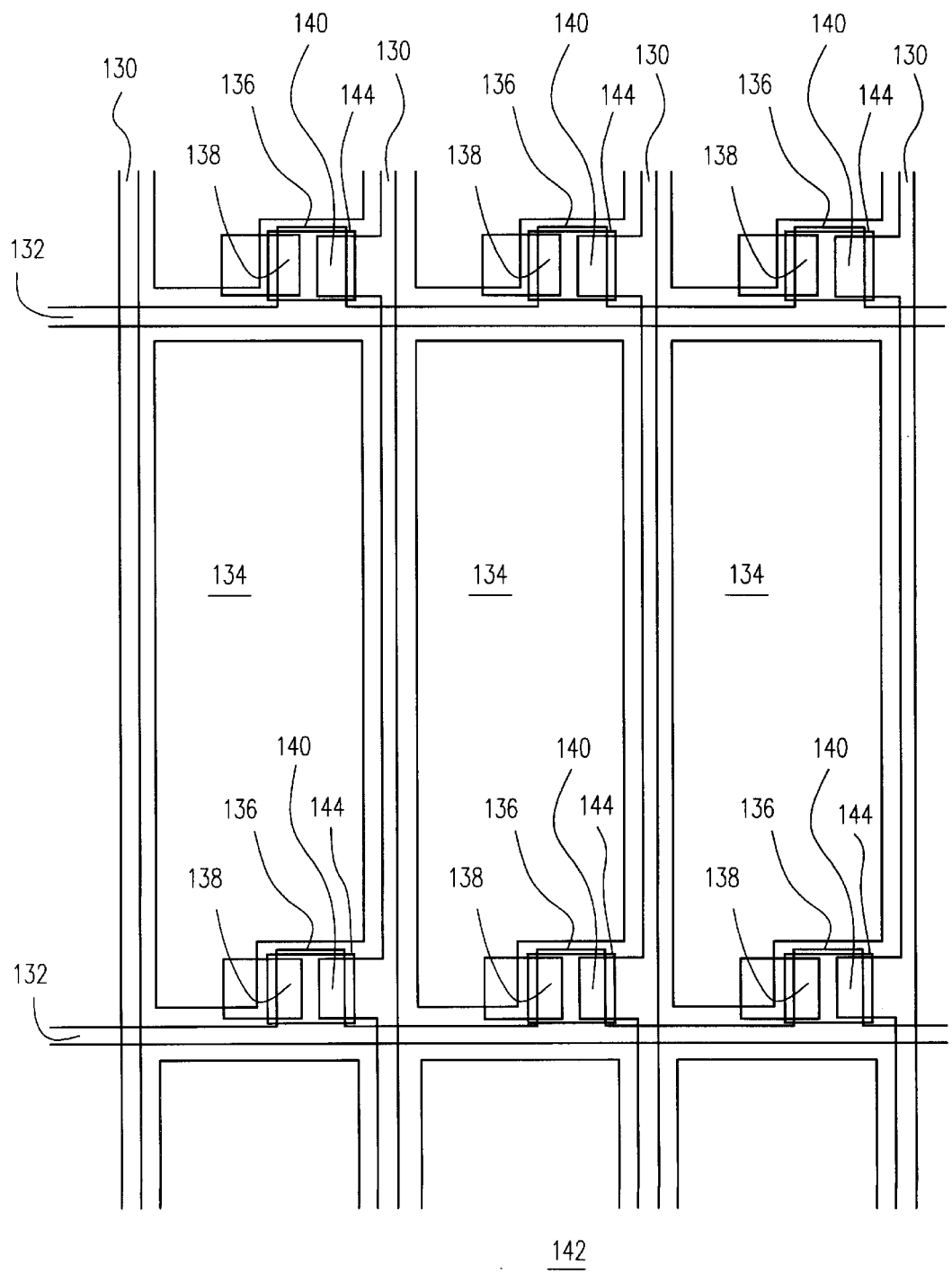
FIG. 16 illustrates the structure of a TFT/LCD.
Figure 17:
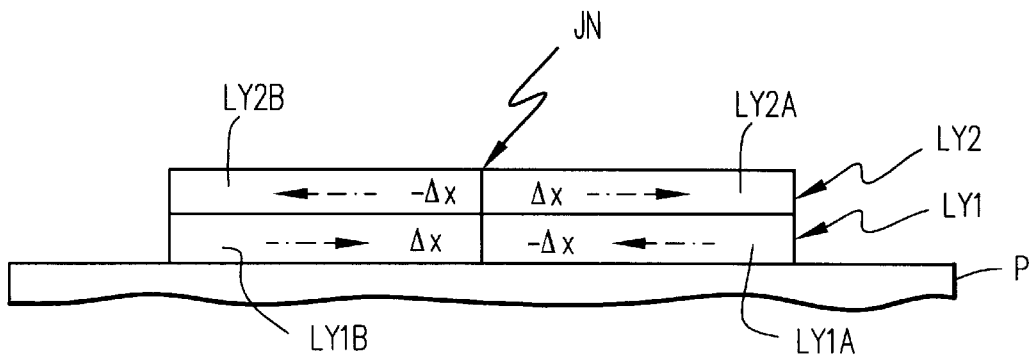
FIG. 17 is a cross-sectional view showing a prior art method for stitching patterns in the first and second layers.
Figure 18:
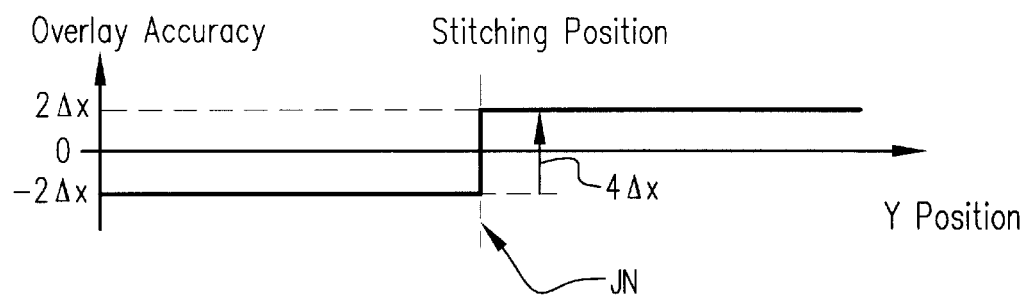
FIG. 18 shows how the overlaying accuracy changes with the prior art method.
Figure 19:
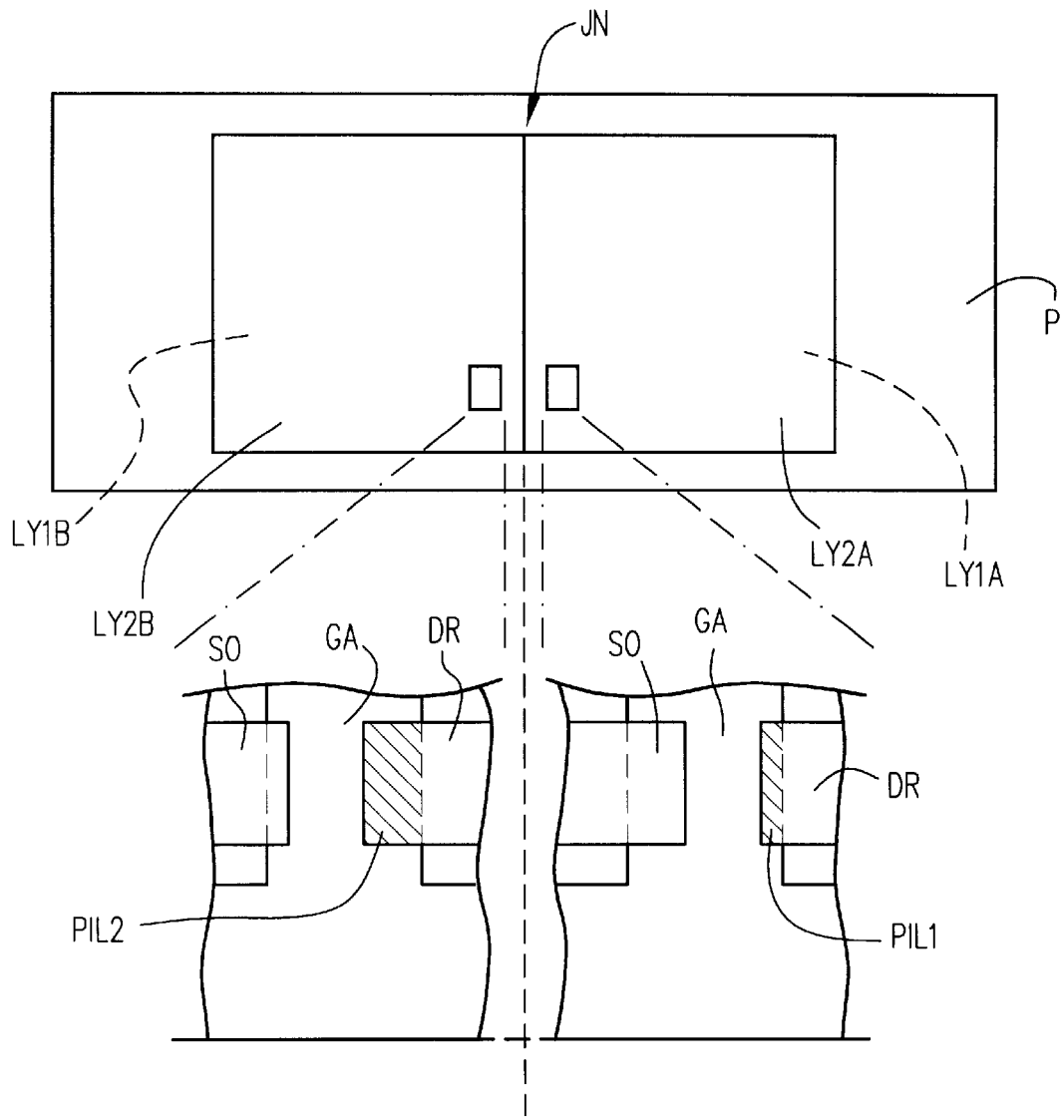
FIG. 19 illustrates variation in the overlapping area of electrodes in the prior art.
Figure 20:
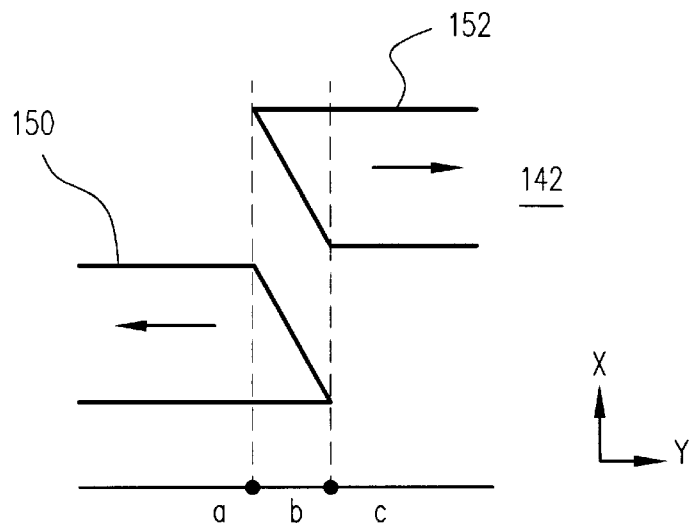
FIGS. 20(a)–(b) show how projection areas overlap each other and the resultant overlay error in the prior art.
Figure 20:
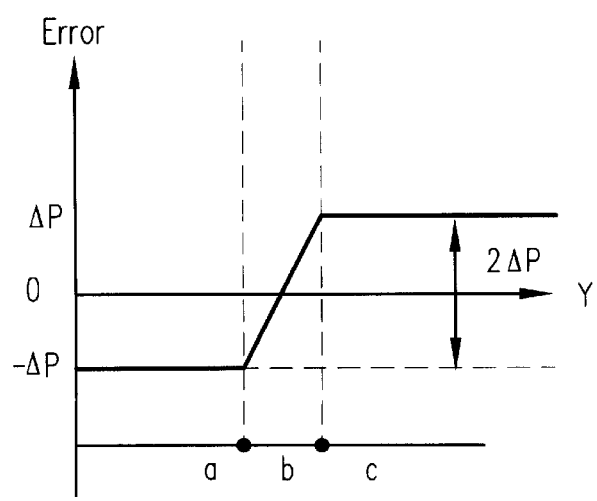
Figure 21:
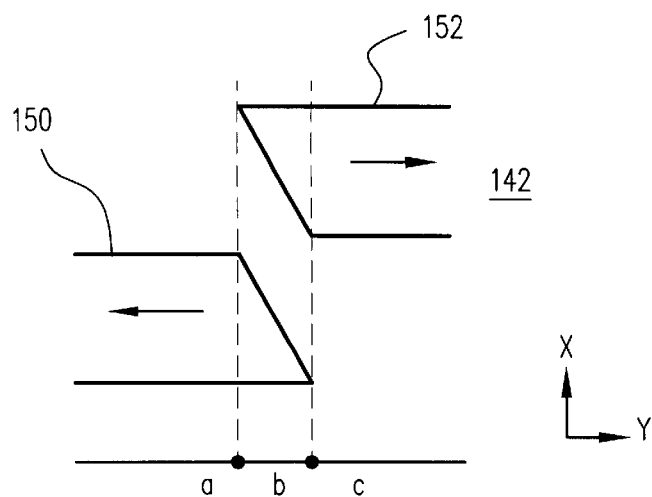
FIGS. 21(a)–(c) show how projection areas overlap each other and the resultant overlay error in the prior art.
Figure 21:
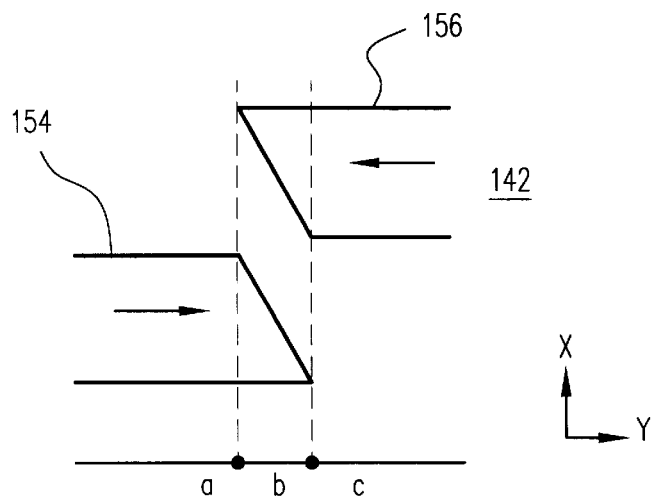
Figure 21:
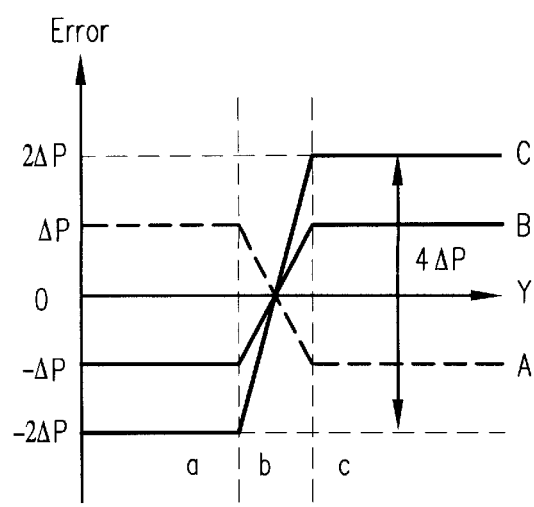
Figure 22:
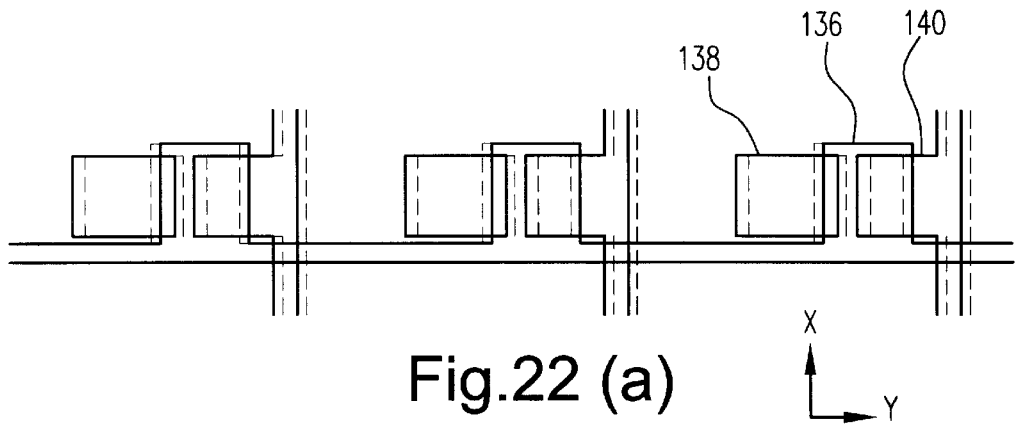
FIGS. 22(a)–(c) illustrate overlay error in each TFT in the prior art.
Figure 22:
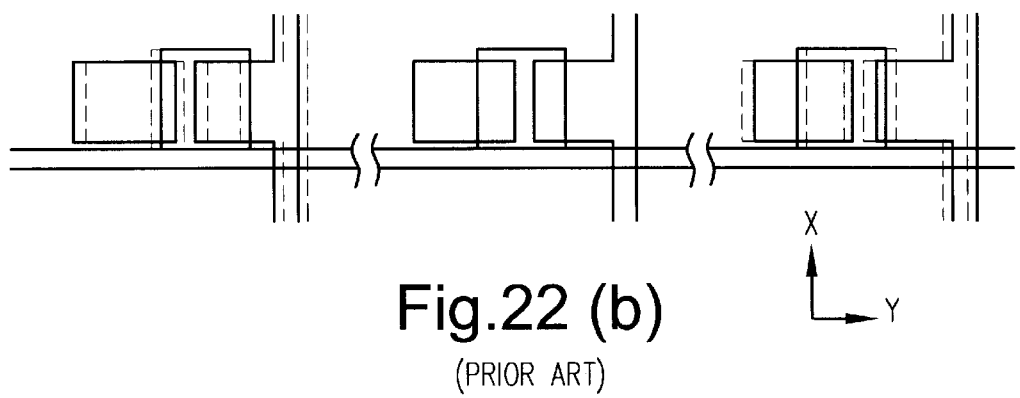
Figure 22:
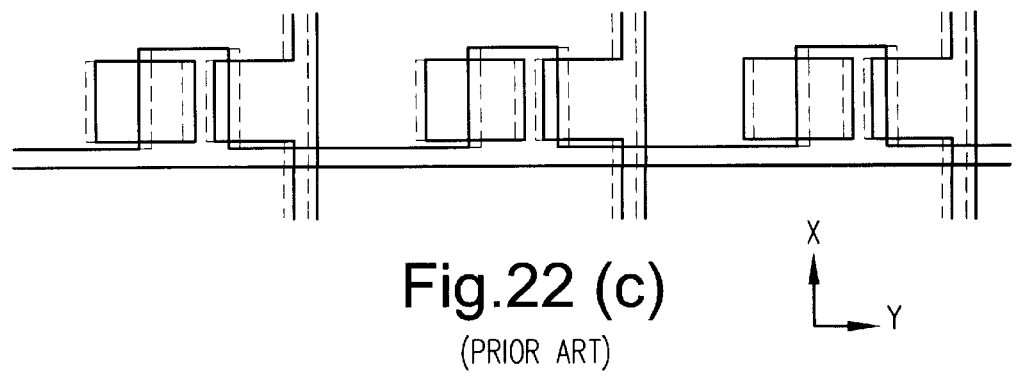

FIG. 15(c) shows overlay errors that occur in the projection exposure method of the third embodiment. The gate electrode (lower layer) is formed on the glass substrate 104 using the scanning-type projection exposure apparatus 100, and the source/drain electrodes (upper layer) are formed using the scanning-type projection exposure apparatus 100'. The horizontal axis represents a Y position, and the vertical axis represents an error.

The dashed line A indicates the positional shift of the gate electrode formed in the lower layer, and the solid line B indicates the positional shift of the source/drain electrodes formed in the upper layer. The bold solid line C indicates the overlay error (C=B−A) between the gate electrode and the source/drain electrodes. The overlay error equals the offset of the upper source/drain electrodes relative to the lower gate electrode. Therefore, the overlay error of the source/drain electrodes with respect to the gate electrode becomes −2ΔP in the area a. The overlay error of the source/drain electrodes with respect to the gate electrode becomes 2ΔP in the area c.

The stitching portion (area b) of the gate electrode layer and the stitching portion (area b") of the source/drain electrode layer do not overlap each other. Accordingly, the overlay error changes from −2ΔP to zero (0) in the area b, corresponding to the positional shift of the gate electrode.

The overlay error in the area b' located between the lower layer stitching portion (area b) and the upper layer stitching portion (area b") becomes zero, because the imagery characteristics of the projection lens systems 105e and 105a' that form the projection areas 107 and 107a', respectively, are the same, and the gate electrode formed in the projection area 107e and the source/drain electrode formed in the projection area 107a' contain a positional error of the same direction and the same magnitude.

The overlay error changes from zero (0) to +2ΔP in the area b" corresponding to the positional shift of the source/drain electrode.

In this embodiment, the position of the stitching portion in the upper layer (i.e., the source/drain layer) is offset from the position of the stitching portion in the lower layer (i.e., the gate electrode layer) by a distance equal to twice the width of the stitching portion. Accordingly, the change of the overlay error in the stitching portion can coincide with the change of the positional error of the stitching portion. The positional shift of the stitching portion is set to be greater than the width of the stitching portion, so that the stitching portions of the upper and lower layers do not adversely affect each other. Consequently, the change of the overlay error is reduced to 2ΔP from 4ΔP which is the conventional maximum overlay error. Moreover, the overlay error changes in two steps because of the extra area b", and the rate of change (i.e., the slope of the bold line C) can be made more gradually than in the second embodiment. Several TFTs are formed between two TFTs, which have different characteristics, so that the TFT characteristics change gradually in this area, thereby reducing the screen separation caused by the variation in the imagery characteristics of the projection lens systems.

The maximum overlay error can be reduced by half, as compared with the conventional method, and thus, screen separation is not recognizable even if the stitching portions increase because of shifting the position of the stitching portions.

The pattern and the glass substrate are shifted in the Y direction relative to the projection lens system of the scanning-type projection exposure apparatus by a distance twice the width of the stitching portion b. This arrangement can prevent screen separation from being conspicuous, which is caused by a change of the TFT characteristic in stitching portions due to the overlay error between the gate electrode and source/drain electrodes.

Screen separation is a phenomenon wherein differences in the image quality of the left and right halves of the screen become visible because of abrupt changes of the overlay accuracy in the stitching portion. According to the projection exposure method of this embodiment, the overlay error that occurs in the stitching portion changes gradually, as compared with the conventional method, and screen separation can be sufficiently suppressed.

The present invention is not meant to be limited to the embodiments described above, and those of ordinary skill in the art will contemplate many modifications and substitutions that fall within the scope of the invention.

For example, the positional shift of the stitching portion is set equal to the width of the stitching portion (area b) in the second embodiment, and it is set to about twice the width of the stitching portion in the third embodiment. The positional shift of the stitching portion, however, may be less than the width of the stitching portion, as that amount of position shift can also change the overlay error in the stitching portions so as to suppress screen separation.

Although a gate electrode layer and a source/drain electrode layer are exposed, as an example of layers that affect screen separation, the invention can be applied to the case in which an accumulated capacitive line and a display electrode are exposed and layered.

In the second embodiment, the position of the upper layer reticle 102' in the reticle stage is shifted in the Y direction with respect to the position of the lower layer reticle 102 by a predetermined distance in order to shift the stitching portion of the upper layer. The invention, however, is not limited to this method, and any method can be used as long as the stitching portion of the upper layer is offset from the stitching portion of the lower layer. For example, the position of a source/drain electrode pattern formed on a reticle may be shifted a predetermined distance in the Y direction, with respect to the position of a gate electrode pattern formed on another reticle. The position of the apertures of the field stops and the position of the projection lens systems 105a'–105g' of the scanning-type projection exposure apparatus 102' can be shifted a predetermined distance in the Y direction with respect to the positions of the field stop aperture and the projection lens systems 105a–105g of the scanning-type projection exposure apparatus 100.

Alternatively, one of the layers that may affect screen separation may be shifted in the +Y direction, while the other layer may be shifted in the −Y direction during exposure so that the patterns on the layers relatively offset from each other by a predetermined amount.

In the second embodiment, the reticle 102 and the glass substrate 104 are held within a horizontal plane, as shown in FIG. 12. However, a scanning-type projection exposure apparatus with a vertical stage may be used, in which the reticle 102 and the glass substrate 104 may be held within a vertical plane (along the Z axis).

Thus, according to the invention, the overlay error can be sufficiently suppressed, and screen separation that deteriorates the image quality of a TFT/LCD can be reduced.

What is claimed is:

1. An exposure method comprising the steps of:
   forming a first layer exposure pattern having a first plurality of unit patterns on a photosensitive substrate and connecting the first plurality of unit patterns through at least one first layer stitching portion; and
   forming a second layer exposure pattern having a second plurality of unit patterns on the photosensitive substrate overlaying the first layer exposure pattern and connecting the second plurality of unit patterns through at least one second layer stitching portion, wherein the second layer forming step comprises offsetting the second layer stitching portion from the first layer stitching portion.

2. The exposure method of claim 1, wherein the offsetting step comprises offsetting the second layer stitching portion from the first layer stitching portion by at least 1.5 mm.

3. The exposure method of claim 1, wherein the first layer exposure pattern forming step comprises forming a gate electrode of a thin film transistor within a liquid crystal panel, and wherein the second layer exposure pattern forming step comprises forming a source electrode and a drain electrode of the thin film electrode.

4. The exposure method of claim 1, further comprising, prior to the forming steps, the step of providing the first plurality of unit patterns with dimensions different from the second plurality of unit patterns, and providing the first layer stitching portion offset from the second layer stitching portion.

5. The exposure method of claim 1, wherein the step of connecting the first plurality of unit patterns comprises connecting the first plurality of unit patterns trough at least two first layer stitching portions, and wherein the step of connecting the second plurality of unit patterns comprises connecting the second plurality of unit patterns through at least two second layer stitching portions, the offsetting step comprising offsetting each of the at least two second layer stitching portions from the at least two first layer stitching portions.

6. A substrate on which said pattern has been formed by the method of claim 1.

7. An exposure method comprising:
   (a) forming a first layer exposure pattern having a first plurality of unit patterns on a photosensitive substrate and connecting the first plurality of unit patterns through at least one first layer stitching portion;
   (b) forming a second layer exposure pattern having a second plurality of unit patterns on the photosensitive substrate overlaying the first layer exposure pattern and connecting the second plurality of unit patterns through at least one second layer stitching portion; and (c) smoothing a contrast between the second plurality of unit patterns overlaying the first plurality of unit patterns.

8. The exposure method of claim 7, wherein step (c) is practiced by offsetting the second layer stitching portion from the first layer stitching portion.

9. A substrate on which said pattern has been formed by the method of claim 8.

10. An exposure apparatus for forming a first layer and a second layer on a photosensitive substrate, the exposure apparatus comprising:

an illumination optical system illuminating a mask with luminous flux emitted from a light source, a plurality of divided patterns being formed on the mask through stitching portions wherein a stitching portion in the first layer is disposed offset from a stitching portion in the second layer;

a blind disposed in an optical path of the luminous flux, the blind changing a dimension of an illumination area on the mask illuminated by the illumination optical system;

a projection lens system disposed in the optical path on a side of the mask opposite from the illumination optical system, the projection lens system projecting the luminous flux having passed through the mask onto the photosensitive substrate; and a controller communicating with the blind to control a position of the blind in accordance with the divided patterns.

11. The exposure apparatus of claim 10, further comprising a mask stage supporting a plurality of masks defining the plurality of divided patterns, wherein the controller communicates with the mask stage to control a position of the mask stage in accordance with one of the masks.

12. The exposure apparatus of claim 11, wherein each mask comprises a plurality of divided patterns formed through stitching portions, and wherein stitching portions of respective masks are disposed offset from one another relative to the optical path.

13. A mask set including a plurality of masks for forming a first layer and a second layer on a photosensitive substrate, each of said masks having a unit pattern with an overlap pattern for a stitching exposure technique formed thereon, wherein the unit pattern on one mask has different dimensions from dimensions of the unit pattern of another mask.

14. An exposure method comprising the steps of:

projecting a portion of a first pattern into one of a plurality of first projection areas on a photosensitive substrate, the first projection areas being separate from each other with adjacent projection areas overlapping each other by a predetermined overlap amount in a direction perpendicular to a scanning direction of the substrate;

synchronously scanning the first pattern and the substrate in the scanning direction relative to the plurality of first projection areas to transfer the first pattern onto the substrate;

projecting a portion of a second pattern into a plurality of second projection areas disposed offset from the plurality of first projection areas in the direction perpendicular to the scanning direction by a predetermined distance within a plane defined by the substrate; and synchronously scanning the second pattern and the substrate in the scanning direction relative to the plurality of second projection areas to transfer the second pattern onto the substrate.

15. The projection exposure method of claim 14, further comprising shifting a position of the plurality of second projection areas relative to a position of the plurality of first projection areas.

16. The projection exposure method of claim 15, wherein the first pattern and the second pattern are formed in a reticle illuminated by an illumination optical system, the shifting step comprising shifting a positional arrangement between the substrate and the reticle by the predetermined distance.

17. The projection exposure method of claim 14, wherein the first pattern and the second pattern are formed in a reticle illuminated by an illumination optical system, the method further comprising shifting a position of the plurality of second projection areas from a position of the plurality of first projection areas by shifting a position of the second pattern formed in the reticle in the direction perpendicular to the scanning direction relative to the position of the first pattern formed in the reticle by the predetermined distance within the substrate plane.

18. The projection exposure method of claim 17, wherein the step of shifting a position of the plurality of second projection areas from a position of the plurality of first projection areas further comprises shifting the position of the substrate relative to the second pattern from the position of the substrate relative to the first pattern in the direction perpendicular in the scanning direction by the predetermined distance within the substrate plane.

19. The projection exposure method of claim 14, wherein the position of the plurality of second projection areas is shifted from the position of the plurality of first projection areas by shifting a plurality of second projection lens systems that project the second pattern onto the plurality of second projection areas in the direction perpendicular to the scanning direction relative to a plurality of first projection lens systems that project the first pattern onto the plurality of first projection areas by the predetermined distance.

20. The projection exposure method of claim 14, wherein the predetermined distance is substantially equal to the predetermined overlap amount.

21. The projection exposure method of claim 14, wherein the predetermined distance is within the range from the predetermined overlap amount to twice the predetermined overlap amount.

22. A substrate on which said pattern has been formed by the method of claim 16.

* * * * *